(12) United States Patent
Lee et al.

(10) Patent No.: US 12,183,660 B2
(45) Date of Patent: Dec. 31, 2024

(54) SEMICONDUCTOR DEVICE INCLUDING THROUGH-SILICON VIA AND METHOD OF FORMING THE SAME

(71) Applicant: Samsung Electronics Co., Ltd., Suwon-si (KR)

(72) Inventors: Jeonil Lee, Suwon-si (KR); Jongmin Lee, Hwaseong-si (KR); Jimin Choi, Seoul (KR); Yeonjin Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 415 days.

(21) Appl. No.: 17/736,212

(22) Filed: May 4, 2022

(65) Prior Publication Data
US 2023/0116911 A1      Apr. 13, 2023

(30) Foreign Application Priority Data

Oct. 13, 2021   (KR) .......................... 10-2021-0135450

(51) Int. Cl.
*H01L 23/48* (2006.01)
*H01L 21/768* (2006.01)
*H01L 23/532* (2006.01)
*H01L 23/535* (2006.01)

(52) U.S. Cl.
CPC ...... *H01L 23/481* (2013.01); *H01L 21/76895* (2013.01); *H01L 21/76898* (2013.01); *H01L 23/53228* (2013.01); *H01L 23/53257* (2013.01); *H01L 23/535* (2013.01)

(58) Field of Classification Search
CPC ............. H01L 23/481; H01L 23/53228; H01L 23/53257; H01L 23/535; H01L 21/76895; H01L 21/76898
USPC ........................................................ 257/621
See application file for complete search history.

(56) References Cited

U.S. PATENT DOCUMENTS

| | | | |
|---|---|---|---|
| 7,259,454 B2 | 8/2007 | Tanida et al. | |
| 7,541,677 B2 | 6/2009 | Kawano | |
| 8,168,533 B2 | 5/2012 | Kuo | |
| 8,202,800 B2 | 6/2012 | Chen et al. | |
| 8,551,860 B2 | 10/2013 | Bang et al. | |
| 8,742,535 B2 | 6/2014 | Bachman et al. | |
| 8,791,011 B2 | 7/2014 | Lin et al. | |
| 9,847,276 B2 * | 12/2017 | Kang | ................ H01L 21/76898 |
| 2013/0299950 A1 | 11/2013 | Hummler | |

* cited by examiner

*Primary Examiner* — Tu-Tu V Ho
(74) *Attorney, Agent, or Firm* — Harness, Dickey & Pierce, P.L.C.

(57) ABSTRACT

A semiconductor device includes a substrate including a first surface, and a second surface opposing the first surface. A via insulating layer extending through the substrate is disposed. A through-silicon via extending through the via insulating layer is disposed. The center of the through-silicon via is misaligned from the center of the via insulating layer. A blocking layer is disposed on the first surface. A first insulating layer is disposed on the blocking layer. A contact plug contacting the through-silicon via and extending through the first insulating layer and the blocking layer is disposed.

20 Claims, 18 Drawing Sheets

SEMICONDUCTOR DEVICE INCLUDING THROUGH-SILICON VIA AND METHOD OF FORMING THE SAME

CROSS-REFERENCE TO THE RELATED APPLICATION

This non-provisional patent application claims priority under 35 U.S.C § 119 from Korean Patent Application No. 10-2021-0135450, filed on Oct. 13, 2021, in the Korean Intellectual Property Office, the disclosure of which is incorporated herein by reference in its entirety.

BACKGROUND

Some example embodiments of inventive concepts relate to a semiconductor device including a through-silicon via (TSV), and/or a method of forming the same.

In accordance with high integration of a semiconductor device, technology for using a through-silicon via extending through a substrate is being attempted. A side surface of the through-silicon via should be electrically insulated from the substrate. When a constituent material of the through-silicon via is diffused between components of active or passive devices on the substrate, failure of and/or reduction in reliability of electrical characteristics of the active or passive devices on the substrate may occur.

SUMMARY

Some example embodiments of inventive concepts provide semiconductor devices having improved or excellent electrical characteristics, and/or a method of forming the same.

A semiconductor device according to some example embodiments may include a substrate including a first surface and a second surface opposing the first surface. A via insulating layer extending through the substrate is included. A through-silicon via extending through the via insulating layer is included. A center of the through-silicon via is misaligned from a center of the via insulating layer. A blocking layer is on the first surface. A first insulating layer is on the blocking layer. A contact plug contacting the through-silicon via and extending through the first insulating layer and the blocking layer is included.

A method of forming the semiconductor device in accordance with some example embodiments includes forming a via insulating layer extending through the substrate. The forming the via insulating layer includes performing a first thin film formation process at between 400° C. to 1,300° C. The method includes forming the contact plug. The method includes forming the through-silicon via after formation of the via insulating layer and the contact plug.

A semiconductor device according to some example embodiments includes a substrate including a first surface and a second surface opposing the first surface. A via insulating layer extending through the substrate is included. The via insulating layer has a width relatively increasing as the via insulating layer extends toward the first surface, and having a width relatively decreasing as the via insulating layer extends toward the second surface. A through-silicon via extending through the via insulating layer is included. The through-silicon via has a width relatively decreasing as the through-silicon via extends toward the first surface and having a width relatively increasing as the through-silicon via extends toward the second surface. A blocking layer is on the first surface. A first insulating layer on the blocking layer. A contact plug contacting the through-silicon via and extending through the first insulating layer and the blocking layer is included.

A method of forming a semiconductor device in accordance with some example embodiments includes providing a substrate including a first surface and a second surface opposing the first surface. A via insulating layer is formed in the substrate. The forming the via insulating layer includes performing a first thin film formation process at between 400° C. to 1,300° C. A blocking layer is formed on the first surface and the via insulating layer. A first insulating layer is formed on the blocking layer. A contact plug extending through the first insulating layer and the blocking layer is formed. A through-silicon via contacting the contact plug and extending through the via insulating layer is formed. The formation of the through-silicon via includes a lithography process.

A method of forming a semiconductor device in accordance with some example embodiments includes providing a substrate including a first surface and a second surface opposing the first surface. A via insulating layer is formed in the substrate. The via insulating layer has a width relatively increasing as the via insulating layer extends toward the first surface and has a width relatively decreasing as the via insulating layer extends toward the second surface. A blocking layer is formed on the first surface and the via insulating layer. A first insulating layer is formed on the blocking layer. A contact plug extending through the first insulating layer and the blocking layer is formed. A through-silicon via contacting the contact plug while extending through the via insulating layer is formed. The through-silicon via has a width relatively decreasing as the through-silicon via extends toward the first surface, and the through-silicon via has a width relatively increasing as the through-silicon via extends toward the second surface.

DETAILED DESCRIPTION OF SOME EXAMPLE EMBODIMENTS

Figure 1:
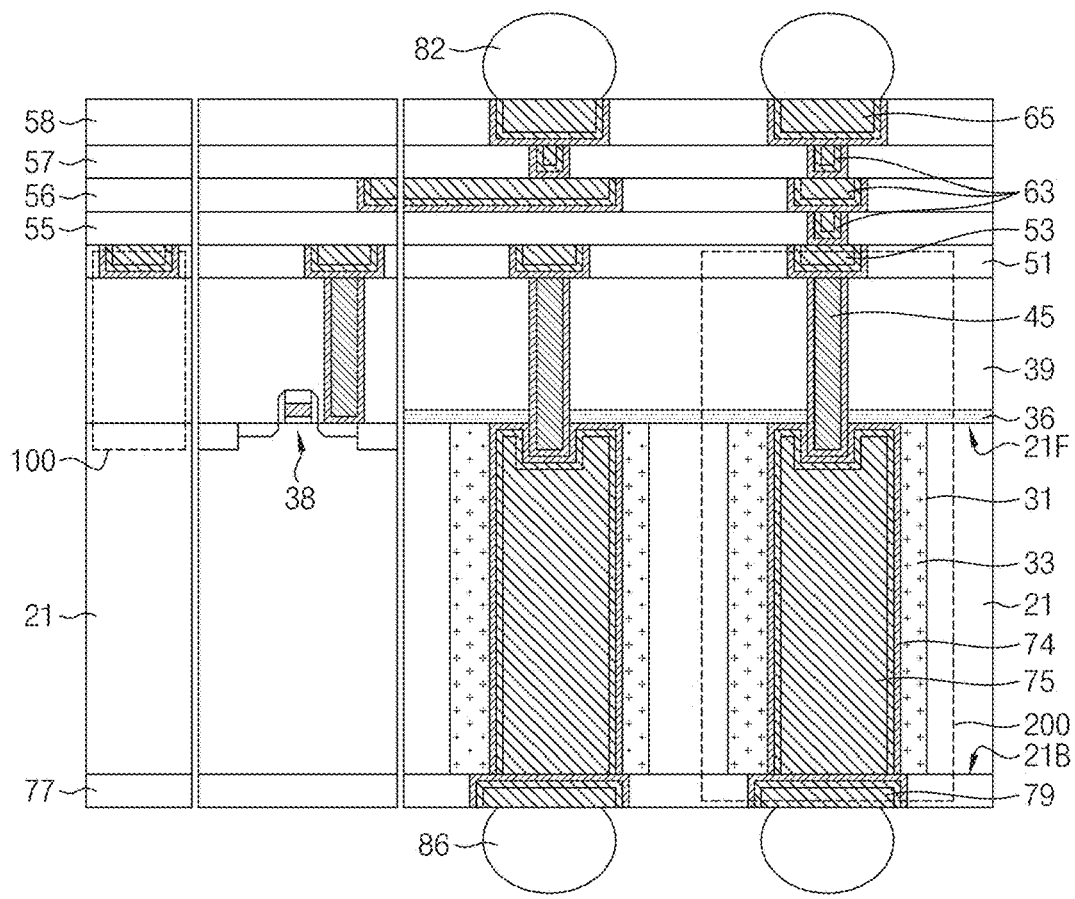
FIG. 1 a sectional view explaining semiconductor devices according to some example embodiments.

FIG. 1 a sectional view explaining semiconductor devices according to some example embodiments.

Referring to FIG. 1, the semiconductor devices according to some example embodiments may include a substrate 21 having a first surface 21F and a second surface 21B and defining a plurality of via holes 31, a plurality of via insulating layers 33, a blocking layer 36, a transistor 38, a first insulating layer 39, a plurality of first contact plugs 45, a second insulating layer 51, a plurality of first wirings 53, a third insulating layer 55, a fourth insulating layer 56, a fifth insulating layer 57, a sixth insulating layer 58, a plurality of second wirings 63, a plurality of first pads 65, a plurality of through holes 74, a plurality of through-silicon vias 75, a seventh insulating layer 77, a plurality of second pads 79, a plurality of first outer terminals 82, and a plurality of second outer terminals 86.

FIGS. 2 to 8 are partial views showing a portion 200 of FIG. 1.

Figure 2:
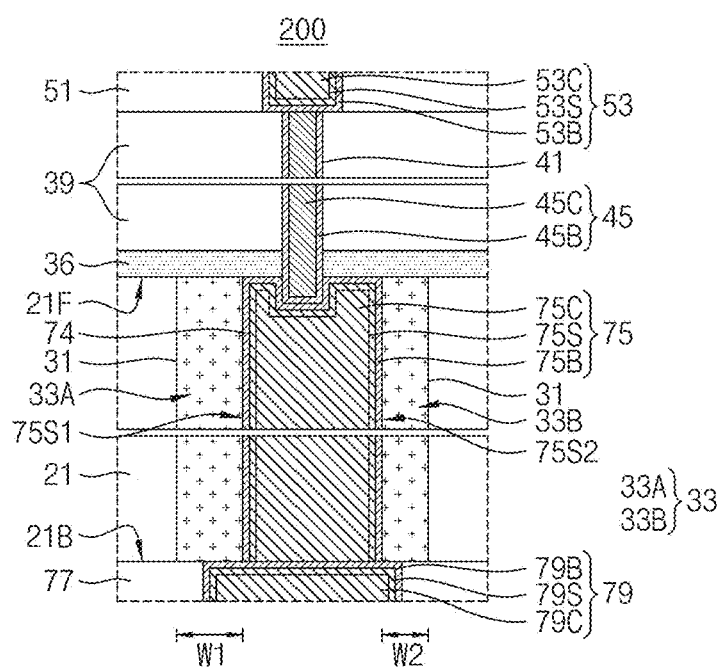
FIGS. 2 to 8 are partial views showing a portion of FIG. 1.

Referring to FIG. 2, the blocking layer 36 may be disposed on the first surface 21F of the substrate 21. The first insulating layer 39 may be disposed on the blocking layer 36. The second insulating layer 51 may be disposed on the first insulating layer 39. A first contact hole 41 extending through the first insulating layer 39 and the blocking layer 36 may be disposed or defined through the first insulating layer 39. The first contact plug 45 may be disposed in the first contact hole 41. The first wiring 53 may be disposed in the second insulating layer 51. The first wiring 53 may contact the first contact plug 45.

The via hole 31 may extend through the substrate 21. The via insulating layer 33 may be disposed in the via hole 31. The through hole 74 may extend through the via insulating layer 33. The through-silicon via 75 may be disposed in the through hole 74. The blocking layer 36 may extend on the via insulating layer 33 and the through-silicon via 75. The via insulating layer 33 and the through-silicon via 75 may contact, e.g. may directly contact a lower surface of the blocking layer 36. The through-silicon via 75 may contact the first contact plug 45. The seventh insulating layer 77 may be disposed on the second surface 21B of the substrate 21. The second pad 79 may be disposed in the seventh insulating layer 77. The second pad 79 may contact the through-silicon via 75.

The first contact plug 45 may extend at least partly into the through-silicon via 75 while extending through or fully through the first insulating layer 39 and the blocking layer 36. An upper surface of the via insulating layer 33 may contact, e.g. may directly contact the blocking layer 36. The upper surface of the via insulating layer 33 may be substantially coplanar with the first surface 21F. A lowermost end of the first contact plug 45 may be disposed at a lower level than the upper surface of the via insulating layer 33. The distance between the lowermost end of the first contact plug 45 and the second surface 21B may be less than the distance between an uppermost end of the via insulating layer 33 and the second surface 21B. The distance between the lowermost end of the first contact plug 45 and the second surface 21B may be less than the distance between the first surface 21F and the second surface 21B.

An uppermost end of the through-silicon via 75 may be disposed at a higher level than the lowermost end of the first contact plug 45. A distance between the uppermost end of the through-silicon via 75 and the second surface 21B may be greater than a distance between the lowermost end of the first contact plug 45 and the second surface 21B. The horizontal width of the through-silicon via 75 may be greater than the horizontal width of the first contact plug 45. The diameter of the through-silicon via 75 may be greater than the diameter of the first contact plug 45. The through-silicon via 75 may contact a lower surface and a side surface of the first contact plug 45, and may contact the blocking layer 36. The uppermost end of the through-silicon via 75 may be substantially coplanar with the first surface 21F.

The through hole 74 may be misaligned, e.g. may include an alignment error caused by alignment variability in a lithography process. The through hole 74 may be misaligned from the via hole 31. The center of the through hole 74 may be misaligned from the center of the via hole 31, for example by 5% or more of a diameter of the via hole 31. A line perpendicular to the first surface 21F while passing through the center of the through hole 74 may be spaced apart from a line perpendicular to the first surface 21F while passing through the center of the via hole 31. The through hole 74 may exhibit various cross-sectional profiles. The through hole 74 may be formed such that the width of an upper portion of the through hole 74 and the width of a lower portion of the through hole are similar.

The through-silicon via 75 may be misaligned, e.g. may include an alignment error caused by alignment variability in a lithography process. The through-silicon via 75 may be misaligned from the via insulating layer 33, for example by 5% or more of a diameter of the via insulating layer 33. The center of the through-silicon via 75 may be misaligned from the center of the via insulating layer 33. A line perpendicular to the first surface 21F while passing through the center of the through-silicon via 75 may be spaced apart from a line perpendicular to the first surface 21F while passing through the center of the via insulating layer 33. The through-silicon via 75 may exhibit various cross-sectional profiles. The through-silicon via 75 may be formed such that the width of an upper portion of the through-silicon via 75 and the width of a lower portion of the through-silicon via 75 are similar.

The through-silicon via 75 may include a first side surface 75S1, and a second side surface 75S2 opposing the first side surface 75S1. The via insulating layer 33 may include a first portion 33A adjacent to the first side surface 75S1, and a second portion 33B adjacent to the second side surface 75S2. The first portion 33A may have a first horizontal width W1. The second portion 33B may have a second horizontal width W2. The first horizontal width W1 may be greater than the second horizontal width W2.

The first contact plug 45 may include a conductive material such as metal, metal nitride, metal oxide, metal silicide, conductive carbon, polysilicon, amorphous silicon, monocrystalline silicon, or a combination thereof, and may or may not be doped. In some example embodiments, the first contact plug 45 may include a contact barrier layer 45B and a contact conductive layer 45C. The contact barrier layer 45B may surround a side surface and a bottom of the contact conductive layer 45C. The contact barrier layer 45B may include Ti, TiN, Ta, TaN, or a combination thereof. The contact conductive layer 45C may include W.

The first wiring 53 may include a conductive material such as metal, metal nitride, metal oxide, metal silicide, conductive carbon, polysilicon, amorphous silicon, monocrystalline silicon, or a combination thereof, and may be doped or undoped, and may be formed of the same material or of a different material than that of the first contact plug 56. In some example embodiments, the first wiring 53 may include a first barrier layer 53B, a first seed layer 53S, and a first conductive layer 53C. The first seed layer 53S may surround a side surface and a bottom of the first conductive layer 53C. The first barrier layer 53B may surround a side surface and a bottom of the first seed layer 53S.

The through-silicon via 75 may include a second barrier layer 75B, a second seed layer 75S, and a second conductive layer 75C. The second seed layer 75S may surround a side surface and an upper surface of the second conductive layer 75C. The second barrier layer 75B may surround a side surface and an upper surface of the second seed layer 75S. The second pad 79 may include a third barrier layer 79B, a third seed layer 79S, and a third conductive layer 79C. The third seed layer 79S may surround a side surface and an upper surface of the third conductive layer 79C. The third barrier layer 79B may surround a side surface and an upper surface of the third seed layer 79S.

Each of the first barrier layer 53B, the second barrier layer 75B, and the third barrier layer 79B may independently or collectively include Ti, TiN, Ta, TaN, or a combination thereof. Each of the first seed layer 53S, the first conductive layer 53C, the second seed layer 75S, the second conductive layer 75C, the third seed layer 79S, and the third conductive layer 79C may independently or collectively include W, WN, Ru, Ni, Co, Al, AlN, Cu, Sn, Pt, Ag, Au, Zn, Ti, TiN, Ta, TaN, or a combination thereof. For example, each of or at least one of the first seed layer 53S, the second seed layer 75S, and the third seed layer 79S may include a Cu layer formed by chemical vapor deposition and/or physical vapor deposition, and may include the same or different materials from one another. Each of or at least one of the first conductive layer 53C, the second conductive layer 75C, and the third conductive layer 79C may include a Cu layer formed by an electroplating method.

Figure 3:
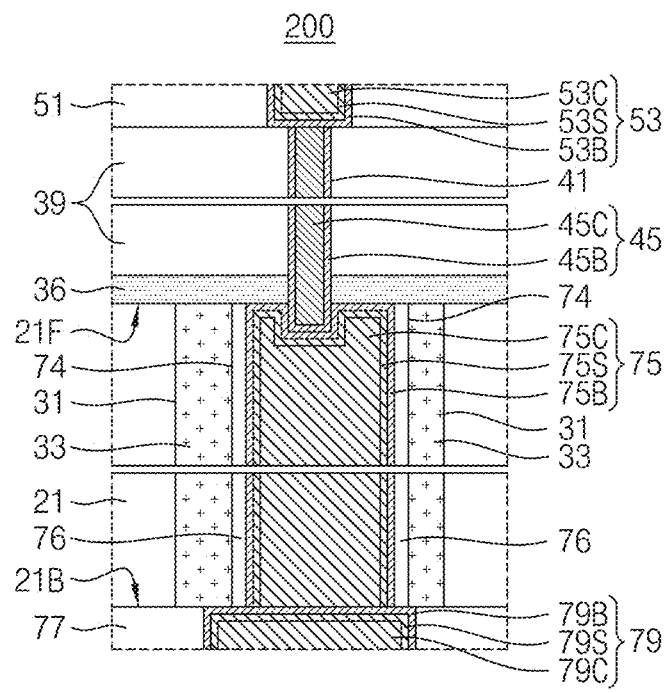

Referring to FIG. 3, a spacer 76 may be formed between the via insulating layer 33 and the through-silicon via 75. The spacer 76 may exhibit a uniform thickness. An upper end of the spacer 76 may contact the blocking layer 36. The spacer 76 may include a single layer or multiple layers. The spacer 76 may include at least two selected from the group consisting of or including Si, O, N, C, H, and B. The spacer 76 may include silicon oxide, silicon nitride, silicon oxynitride, silicon boron nitride (SiBN), silicon carbon nitride (SiCN), low-k dielectrics, high-k dielectrics, or a combination thereof.

Figure 4:
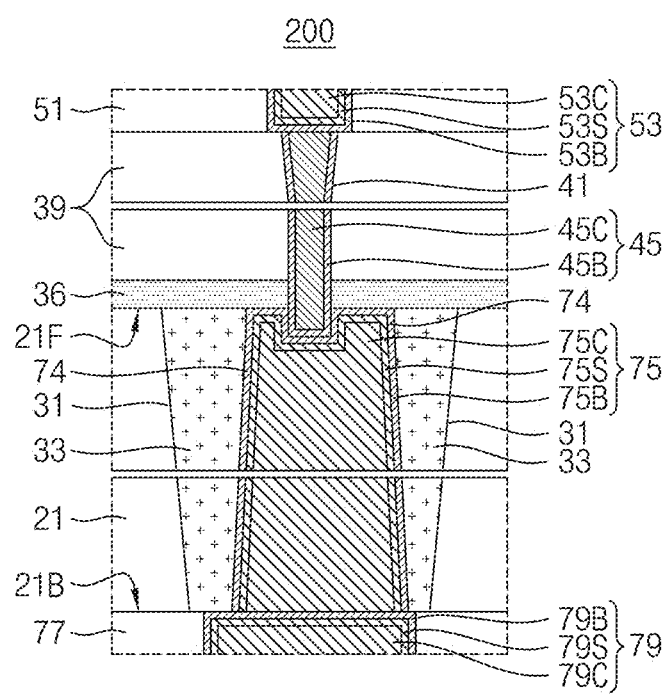

Referring to FIG. 4, each of or at least some of the through hole 74 and the via hole 31 may exhibit various cross-sectional profiles formed by a patterning method.

In some example embodiments, the via hole 31 may be formed such that the width of a lower portion of the via hole 31 is smaller than the width of an upper portion thereof. The via hole 31 may have a width relatively increasing as the via hole 31 extends toward the first surface 21F, and the via hole 31 may have a width relatively decreasing as the via hole 31 extends toward the second surface 21. The via insulating layer 33 may be formed such that the width of a lower portion thereof is smaller than the width of an upper portion thereof. The via insulating layer 33 may have a width relatively increasing as the via insulating layer 33 extends toward the first surface 21F, and the via insulating layer 33 may have a width relatively decreasing as the via insulating layer 33 extends toward the second surface 21B.

In some example embodiments, the through hole 74 may be formed such that the width of a lower portion of the through hole 74 is greater than the width of an upper portion of the through hole 74. The through hole 74 may have a width relatively decreasing as the through hole 74 extends toward the first surface 21F, and the through-silicon via 74 may have a width relatively increasing as the through-silicon via 74 extends toward the second surface 21B. The through-silicon via 75 may be formed such that the width of a lower portion thereof is greater than the width of an upper portion thereof. The through-silicon via 75 may have a width relatively decreasing as the through-silicon via 75 extends toward the first surface 21F, and the through-silicon via 75 may have a width relatively increasing as the through-silicon via 75 extends toward the second surface 21B.

In some example embodiments, a spacer similar to the spacer 76 described with reference to FIG. 3 may be formed between the via insulating layer 33 and the through-silicon via 75.

Figure 5:
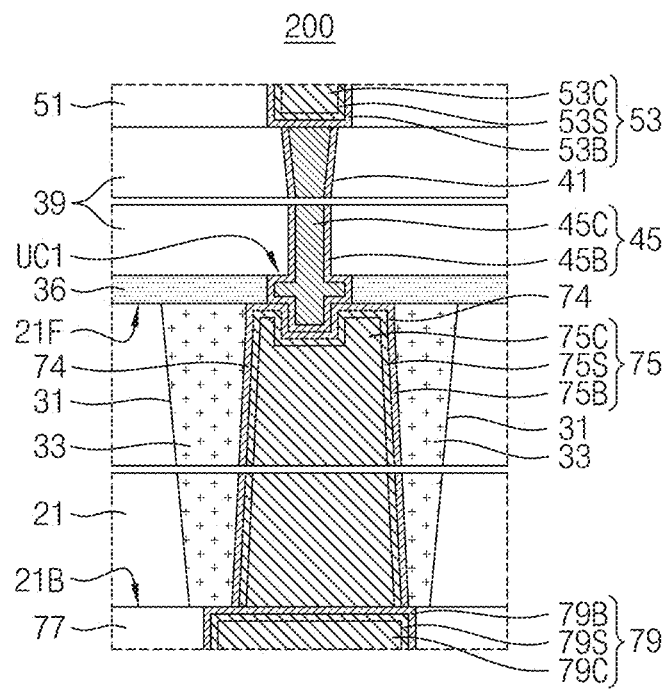

Referring to FIG. 5, an undercut region UC1 may be disposed between the first insulating layer 39 and the through-silicon via 75. The first contact plug 45 may be laterally enlarged or bowed-out between the first insulating layer 39 and the through-silicon via 75.

Figure 6:
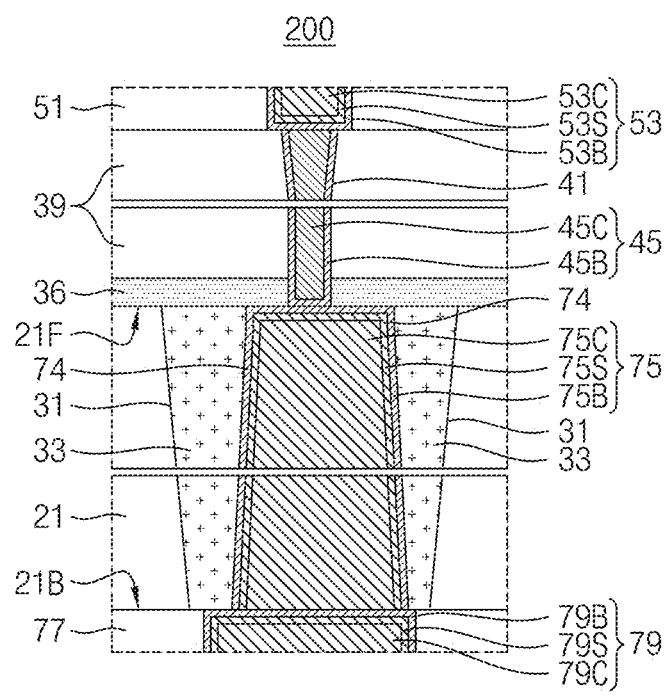

Referring to FIG. 6, the first contact plug 45 may contact the through-silicon via 75 while extending through the first insulating layer 39 and the blocking layer 36. The upper surface of the via insulating layer 33, an upper surface of the through-silicon via 75, a lower surface of the first contact plug 45, and the first surface 21F may be substantially coplanar.

Figure 7:
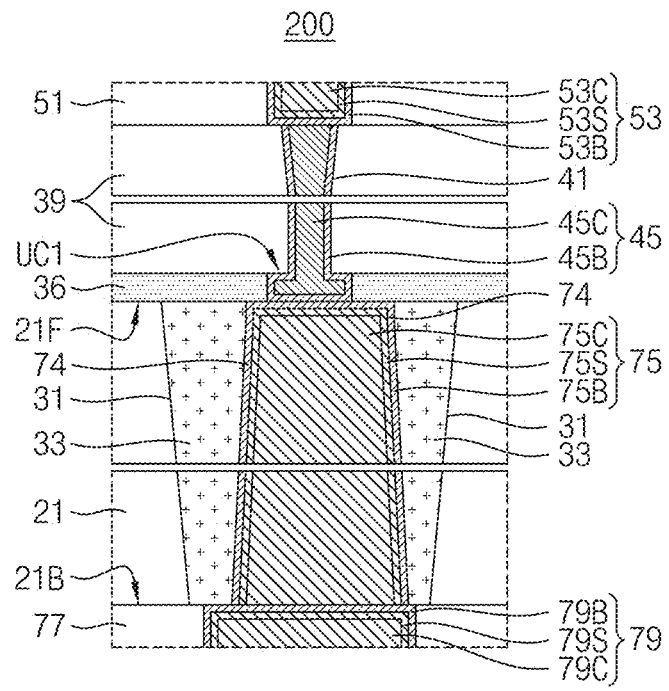

Referring to FIG. 7, an undercut region UC1 may be disposed between the first insulating layer 39 and the through-silicon via 75. The first contact plug 45 may be laterally enlarged between the first insulating layer 39 and the through-silicon via 75. The upper surface of the via insulating layer 33, the upper surface of the through-silicon via 75, the lower surface of the first contact plug 45, and the first surface 21F may be substantially coplanar.

Figure 8:
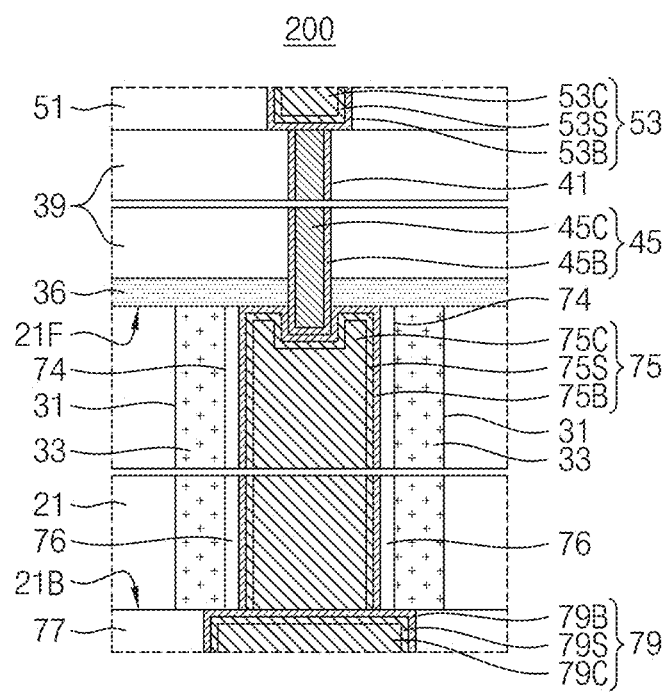

Referring to FIG. 8, the center of the through hole 74 may be aligned with the center of the via hole 31. The center of the through-silicon via 75 may be aligned with the center of the via insulating layer 33. The spacer 76, which surrounds a side surface of the through-silicon via 75, may be formed. The spacer 76 may be disposed between the through-silicon via 75 and the via insulating layer 33. Upper surfaces of the spacer 76, the through-silicon via 75 and the via insulating layer 33 may contact, e.g., may directly contact the blocking layer 36.

FIGS. 9 to 12 are layouts or plan views explaining semiconductor devices according to some example embodiments.

Figure 9:
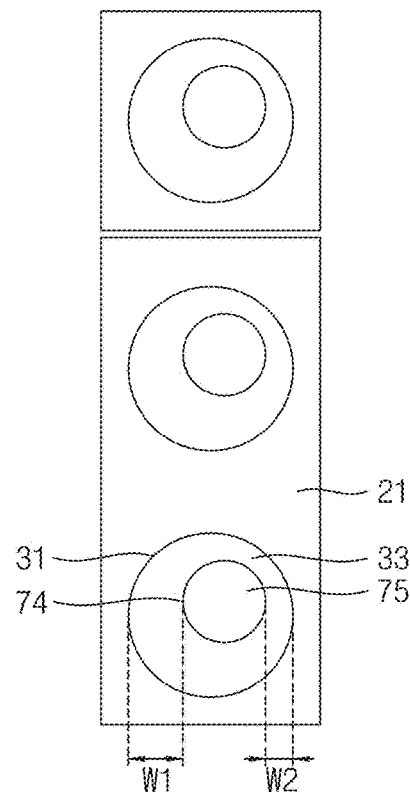
FIGS. 9 to 12 are layouts explaining semiconductor devices according to some example embodiments.

Referring to FIG. 9, a plurality of via holes 31 spaced apart from one another may be disposed in a substrate 21. A plurality of via insulating layers 33 may be disposed in or within the plurality of via holes 31. A plurality of through holes 74 may be disposed in or within the plurality of via insulating layers 33. A plurality of through-silicon vias 75 may be disposed in or within the plurality of through holes 74.

Each of the plurality of through holes 74 may be misaligned, e.g. may include an alignment error caused by alignment variability of a lithography process. Each of the plurality of through holes 74 may be misaligned from a corresponding one of the plurality of via holes 31. The center of each of the plurality of through holes 74 may be misaligned from the center of the corresponding one of the plurality of via holes 31. The misalignment may be in a first horizontal direction and/or in a second horizontal direction that is orthogonal to the first horizontal direction. An amount of misalignment in the first horizontal direction may be the same as, greater than, or less than an amount of misalignment in the second horizontal direction.

Each of the plurality of through-silicon vias 75 may be misaligned, e.g. may include an alignment error caused by alignment variability of a lithography process. Each of the plurality of through-silicon vias 75 may be misaligned from a corresponding one of the plurality of via insulating layers 33. The center of each of the plurality of through-silicon vias 75 may be misaligned from the center of the corresponding one of the plurality of via insulating layers 33.

Figure 10:
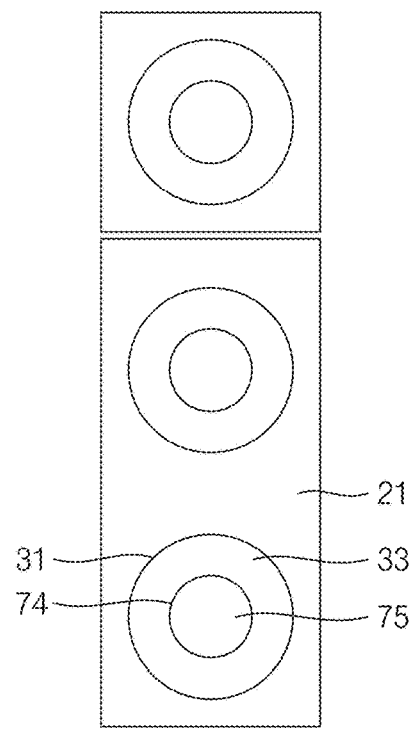

Referring to FIG. 10, each of the plurality of through holes 74 may be aligned with the center of the corresponding one of the plurality of via holes 31. Each of the plurality of through-silicon vias 75 may be aligned with the center of the corresponding one of the plurality of via insulating layers 33.

Figure 11:
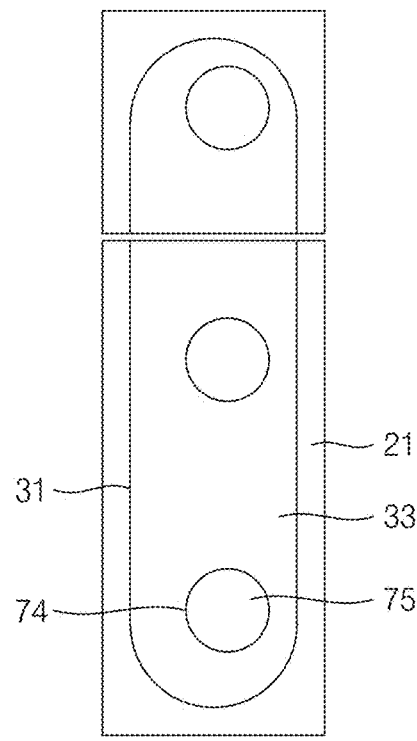

Referring to FIG. 11, a via hole 31 may be disposed in a substrate 21. The via hole 31 may have various shapes. In some example embodiments, the via hole 31 may have a bar shape in which the length of a longer axis is two or more times the length of a shorter axis, when viewed in a plan view. A via insulating layer 33 may be disposed in the via hole 31. A plurality of through holes 74 may be disposed in the via insulating layer 33. A plurality of through-silicon vias 75 may be disposed in the plurality of through holes 74. Each of the plurality of through holes 74 may include an alignment error caused by alignment variability of a lithography process. The center of each of the plurality of through holes 74 may be misaligned from a center line of the via hole 31. Each of the plurality of through-silicon vias 75 may include an alignment error caused by alignment variability of a lithography process. The center of each of the plurality of through-silicon vias 75 may be misaligned from a center line of the via insulating layer 33.

Figure 12:
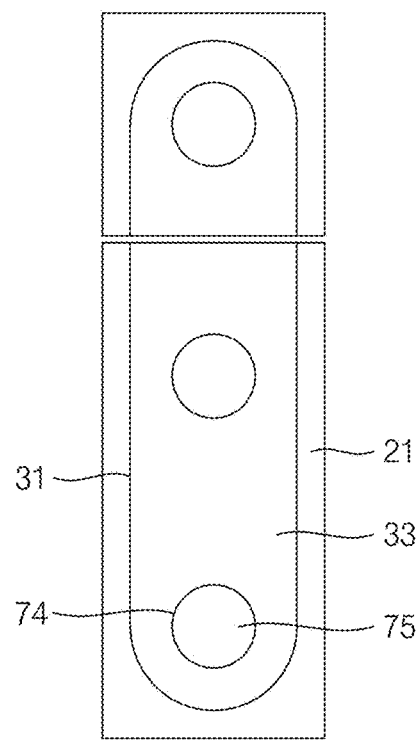

Referring to FIG. 12, each of the plurality of through holes 74 may be aligned with the center line of the via hole 31 in plan view. Each of the plurality of through-silicon vias 75 may be aligned with the center line of the via insulating layer 33 in plan view.

Figure 13:
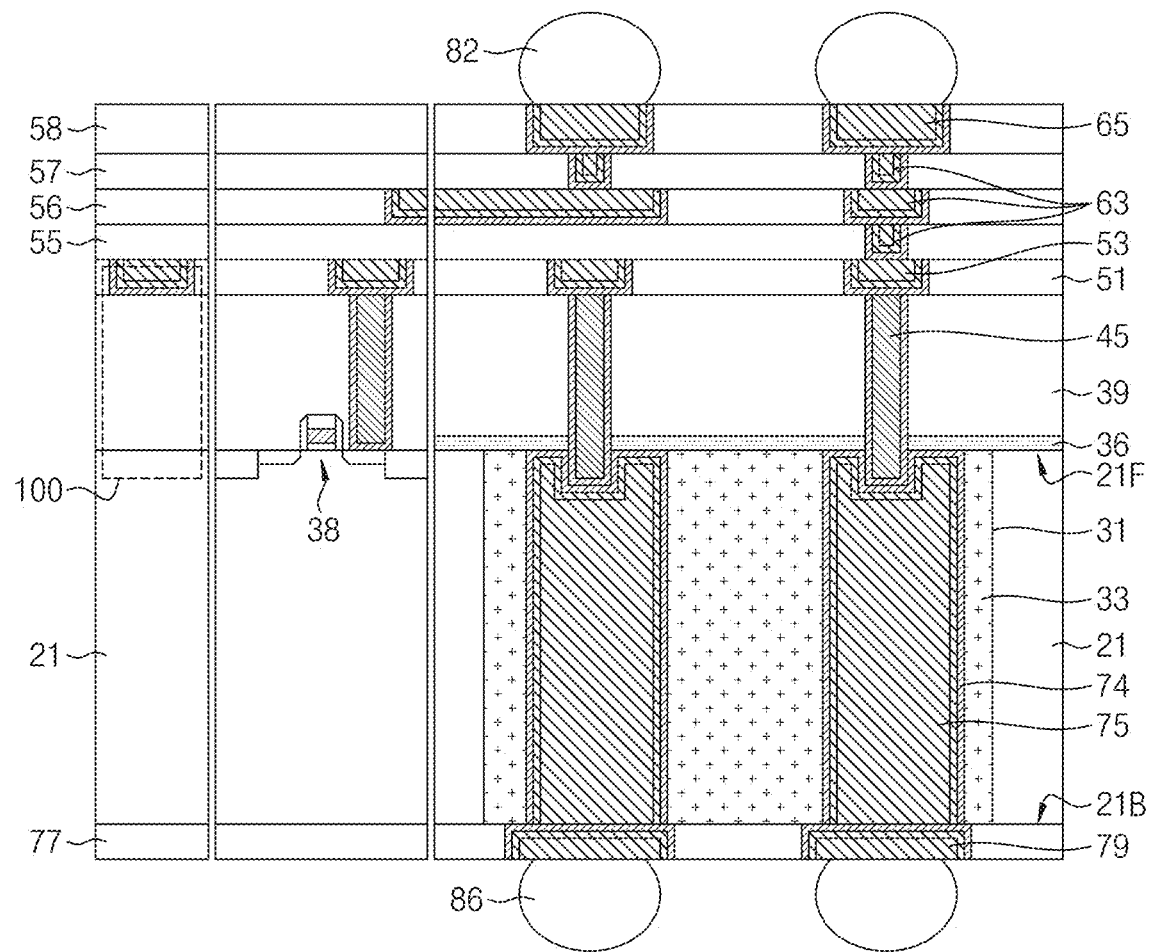
FIG. 13 is a sectional view explaining semiconductor devices according to some example embodiments.

FIG. 13 is a sectional view explaining semiconductor devices according to some example embodiments.

Referring to FIG. 13, a plurality of through holes 74 extending through a via insulating layer 33 may be disposed. A plurality of through-silicon vias 75 may be disposed in the plurality of through holes 74.

Figure 14:
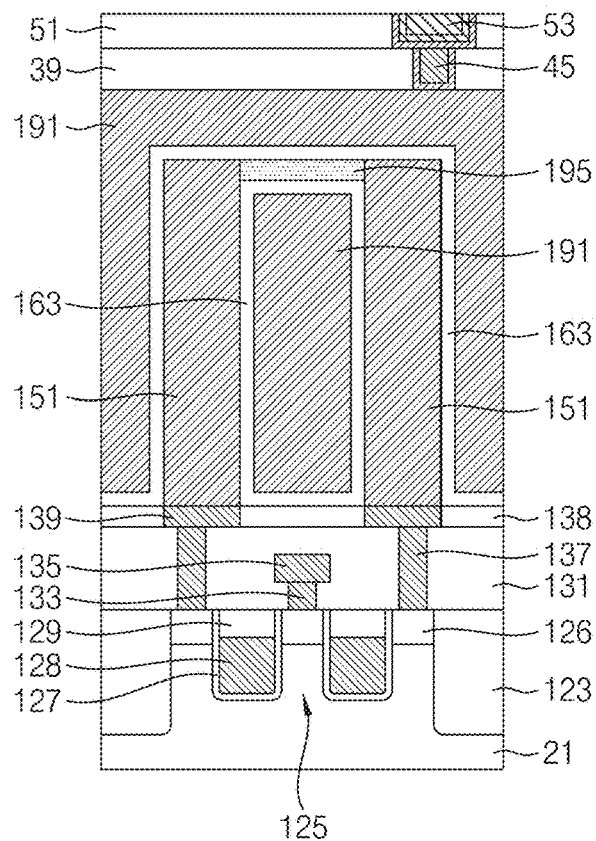
FIG. 14 is a partial view showing portions of FIGS. 1 and 13.

FIG. 14 is a partial view showing portions 100 of FIGS. 1 and 13.

Referring to FIG. 14, an element isolation layer 123 defining an active region 125 may be disposed in the substrate 21. A plurality of gate electrodes 128 may be disposed in the active region 125. A gate capping layer 129 may be formed on the plurality of gate electrodes 128. A gate dielectric layer 127 may be formed between the plurality of gate electrodes 128 and the active region 125. A plurality of source/drain regions 126 may be formed in the active region 125 adjacent to the plurality of gate electrodes 128.

An interlayer insulating layer 131 may be formed on the element isolation layer 123, the active region 125, the plurality of source/drain regions 126, the plurality of gate electrodes 128, and the gate capping layer 129. A bit plug 133, a bit line 135, and a plurality of buried contact plugs 137 may be formed in the interlayer insulating layer 131. The bit plug 133 may be disposed between the bit line 135 and the plurality of source/drain regions 126. The bit plug 133 may contact a corresponding one of the source/drain regions 126 and the bit line 135 while extending through the interlayer insulating layer 131. Each of the plurality of buried contact plugs 137 may contact a corresponding one of the plurality of source/drain regions 126 while extending through the interlayer insulating layer 131.

An etch stop layer 138 may be disposed on the interlayer insulating layer 131. A plurality of landing pads 139, which is connected to the plurality of buried contact plugs 137 while extending through the etch stop layer 138, may be disposed.

A plurality of lower electrodes 151 may be disposed on the plurality of landing pads 139. A support 195 may be disposed among the plurality of lower electrodes 151. An upper electrode 191 may be disposed on the plurality of lower electrodes 151. A capacitor dielectric layer 163 may be disposed between the plurality of lower electrodes 151 and the upper electrode 191. The upper electrode 191 may extend among the plurality of lower electrodes 151. The upper electrode 191 may extend on the support 195. The capacitor dielectric layer 163 may extend between the upper electrode 191 and the support 195 and between the upper electrode 191 and the etch stop layer 138.

A first insulating layer 39 may be disposed on the upper electrode 191. A first contact plug 45 may be disposed in the first insulating layer 39. A second insulating layer 51 may be disposed on the first insulating layer 39. A first wiring pattern 53 may be disposed in the second insulting layer 51.

The active region 125, the plurality of source/drain regions 126, and the plurality of gate electrodes 128 may constitute a plurality of cell transistors. In some example embodiments, each of the plurality of cell transistors may include a planar transistor, a fin field effect transistor (fin-FET), a multi-bridge channel transistor such as an MBCFET®, a nano-wire transistor, a vertical transistor, a recess channel transistor, a 3-D transistor, or a combination thereof. Each of the plurality of lower electrodes 151 may have a pillar shape, a cylindrical shape, a box shape, or a combination thereof.

Each of the plurality of gate electrodes 128 may correspond to a word line or row line. The plurality of lower electrodes 151, the capacitor dielectric layer 163, and the upper electrode 191 may constitute a plurality of cell capacitors. The plurality of cell capacitors may be connected to the plurality of cell transistors. The plurality of cell capacitors and the plurality of cell transistors may constitute or be included in a plurality of DRAM cells such as a plurality of one-transistor, one-capacitor (1T1C) DRAM cells.

Each of the gate dielectric layer 127 and the capacitor dielectric layer 163 may include a single layer or multiple layers. Each of the gate dielectric layer 127 and the capacitor dielectric layer 163 may include at least two selected from the group consisting of or including Si, O, N, C, H, and B, and may or may not include the same elements. Each of the gate dielectric layer 127 and the capacitor dielectric layer 163 may include silicon oxide, silicon nitride, silicon oxynitride, high-k dielectrics (for example, metal oxide and/or metal silicate, etc.), or a combination thereof.

Each of the element isolation layer 123, the gate capping layer 129, the interlayer insulating layer 131, the etch stop layer 138 and the support 195 may include a single layer or multiple layers. Each of the element isolation layer 123, the gate capping layer 129, the interlayer insulating layer 131, the etch stop layer 138 and the support 195 may include at least two selected from the group consisting of or including Si, O, N, C, H and B, and may or may not include the same elements. Each of the element isolation layer 123, the gate capping layer 129, the interlayer insulating layer 131, the etch stop layer 138 and the support 195 may include silicon oxide, silicon nitride, silicon oxynitride, silicon boron nitride (SiBN), silicon carbon nitride (SiCN), low-k dielectrics, high-k dielectrics, or a combination thereof, and may or may not include the same elements.

Each of the plurality of gate electrodes 128, the bit plug 133, the bit line 135, the plurality of buried contact plugs 137, the plurality of landing pads 139, the plurality of lower electrodes 151 and the upper electrode 191 may include a single layer or multiple layers. Each of the plurality of gate electrodes 128, the bit plug 133, the bit line 135, the plurality of buried contact plugs 137, the plurality of landing pads 139, the plurality of lower electrodes 151 and the upper electrode 191 may include a conductive material such as metal, metal nitride, metal oxide, metal silicide, conductive carbon, (doped) polysilicon, (doped) amorphous silicon, (doped) monocrystalline silicon, or a combination thereof. Each of the plurality of gate electrodes 128, the bit plug 133, the bit line 135, the plurality of buried contact plugs 137, the plurality of landing pads 139, the plurality of lower electrodes 151 and the upper electrode 191 may include W, WN, Ru, Ni, Co, Al, AlN, Sn, Pt, Ag, Au, Zn, Ti, TiN, Ta, TaN, or a combination thereof, and each may or may not include a same element.

Figure 29:
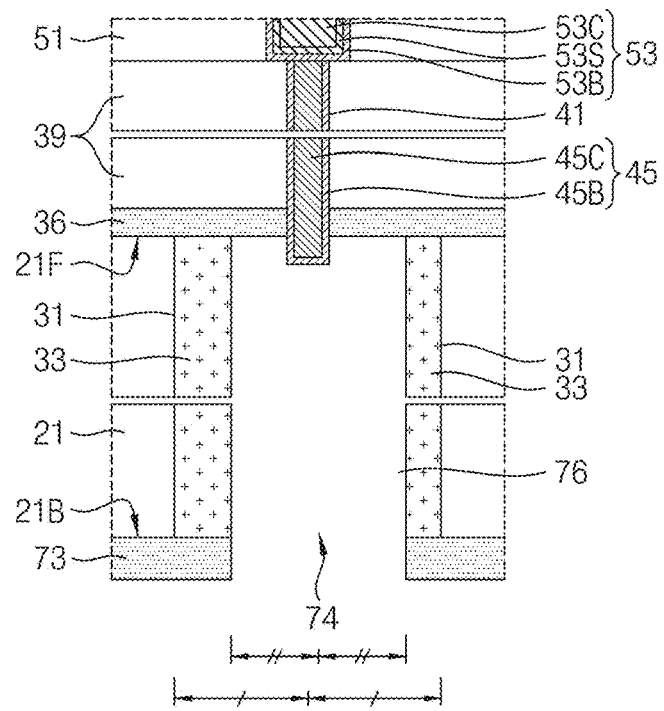
Figure 30:
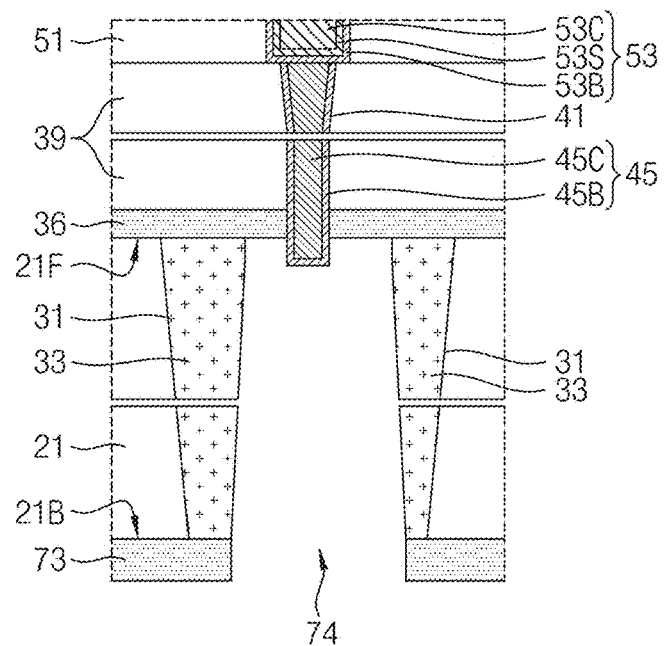
Figure 31:
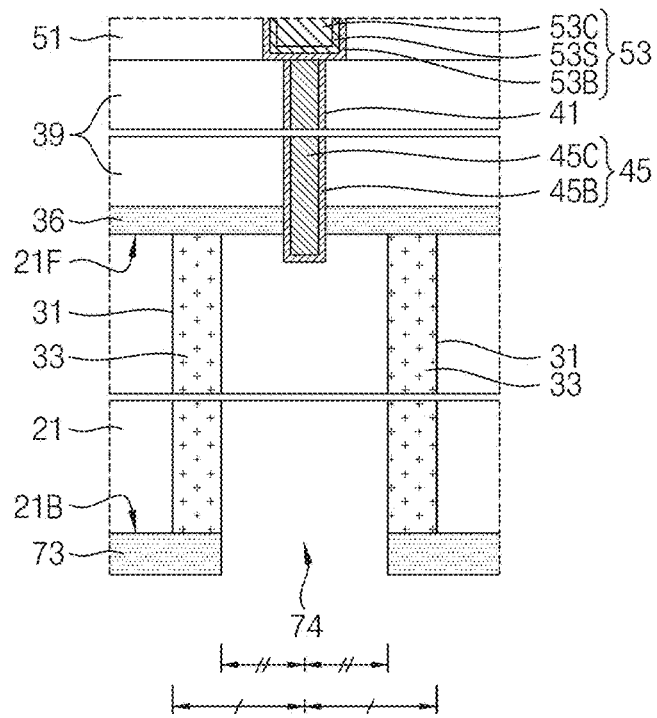

FIGS. 15 to 33 are sectional views explaining semiconductor device formation methods according to some example embodiments. FIG. 16 is a partial view showing a portion of FIG. 15. FIGS. 21 to 24 are partial views of a portion of FIG. 20. FIGS. 29 to 31 are partial views showing a portion of FIG. 28.

Figure 15:
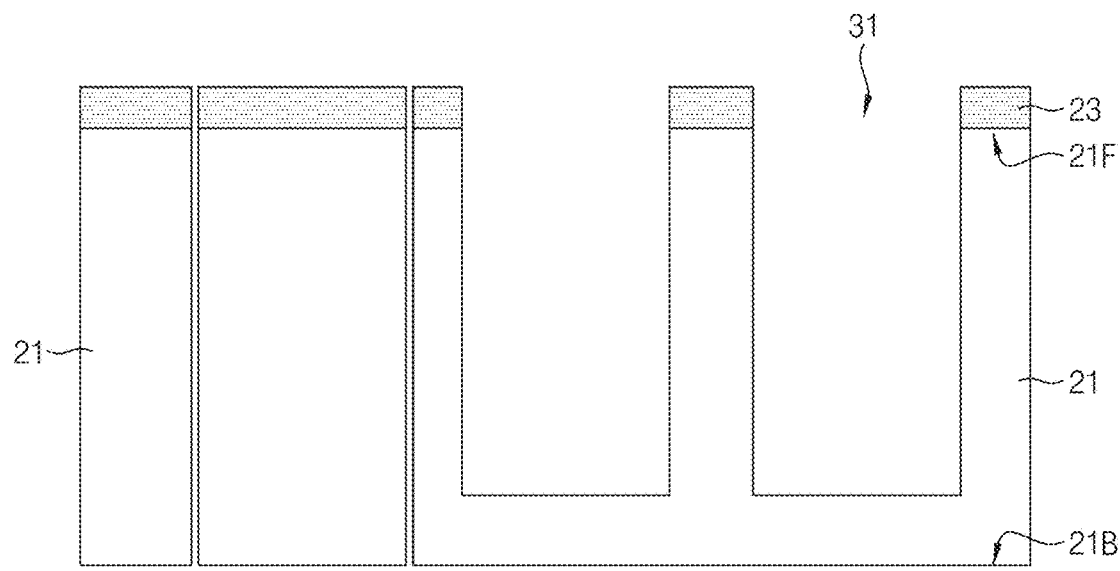
FIGS. 15 to 33 are sectional views explaining semiconductor device formation methods according to some example embodiments.
Figure 16:
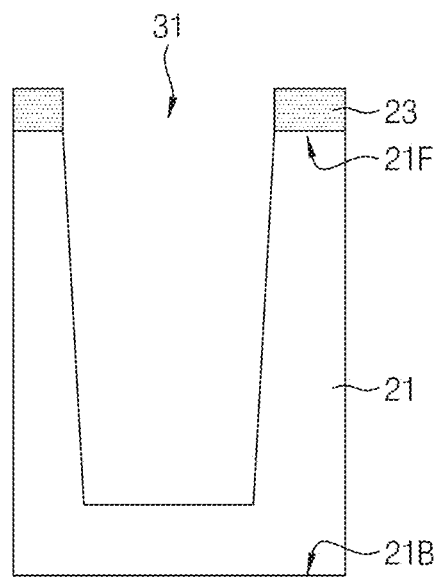

Referring to FIG. 15, a substrate 21 having a first surface 21F and a second surface 21B opposing the first surface 21F may be provided. A first mask pattern 23 may be formed on the substrate 21. Using the first mask pattern 23 as an etch mask, a plurality of via holes 31 may be formed in the substrate 21.

The substrate 21 may include a semiconductor substrate such as a silicon wafer or a silicon-on-insulator (SOI) wafer. The first surface 21F may be referred to as a front surface or an upper surface, and the second surface 21B may be referred to as a back surface or a lower surface. The first mask pattern 23 may be formed on the first surface 21F. Formation of the plurality of via holes 31 may include an anisotropic etching process. Each of the plurality of via holes 31 may extend into the substrate 21 from the first surface 21F toward the second surface 21B. In some example embodiments, each of the plurality of via holes 31 may have a depth of 10 to 100 μm (micrometer). Each of the plurality of via holes 31 may have various cross-sectional profiles. In some example embodiments, each of the plurality of via holes 31 may be formed such that the width of an upper portion thereof and the width of a lower portion thereof are similar.

Referring to FIG. 16, each of the plurality of via holes 31 may be formed such that the width of the lower portion thereof is smaller than the width of the upper portion thereof. In some example embodiments, each of the plurality of via holes 31 may have a width relatively increasing as the via hole 31 extends toward the first surface 21F, and each of the plurality of via holes 31 may have a width relatively decreasing as the via hole 31 extends toward the second surface 21B.

Figure 17:
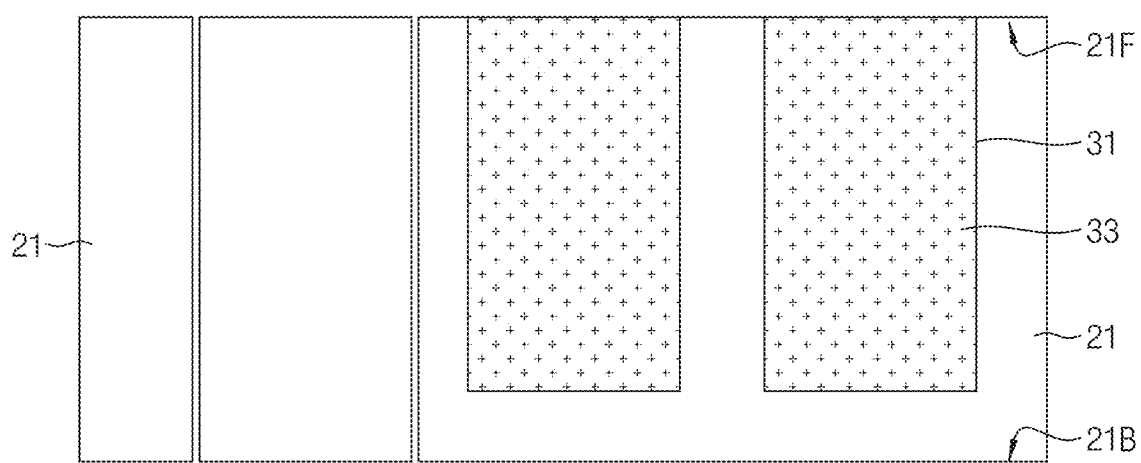

Referring to FIG. 17, a via insulating layer 33 may be formed in the plurality of via holes 31. The first mask pattern 23 may be removed, thereby exposing the first surface 21F. An upper surface of the via insulating layer 33 and the first surface 21F of the substrate 21 may be substantially coplanar.

The via insulating layer 33 may include a single layer or multiple layers. The via insulating layer 33 may include at least two selected from the group consisting of or including Si, O, N, C, H, and B. The via insulating layer 33 may include silicon oxide, silicon nitride, silicon oxynitride, silicon boron nitride (SiBN), silicon carbon nitride (SiCN), low-k dielectrics, high-k dielectrics, or a combination thereof. For example, the via insulating layer 33 may include silicon oxide.

Since a process of forming the via insulating layer 33 is performed prior to a process of forming various active/passive devices in the substrate 21 and/or over the substrate 21, various process conditions may be selectively applied in order to obtain a desired film quality. For example, the process of forming the via insulating layer 33 may be performed under various temperature conditions. The process of forming the via insulating layer 33 may include a first thin film formation process.

The first thin film formation process for forming the via insulating layer 33 may be performed at between 200 to 1,300° C. The process of forming the via insulating layer 33 may include a high-temperature process. In some example embodiments, the first thin film formation process of forming the via insulating layer 33 may be performed at between 400 to 1,300° C. In some example embodiments, the first thin film formation process may be performed at 800 to 900° C. In some example embodiments, the process of forming the via insulating layer 33 may be performed at between 500 to 600° C. For example, the via insulating layer 33 may include Tonen silazane (TOSZ). In some example embodiments, the process of forming the via insulating layer 33 may be performed at 400 to 500° C. For example, the via insulating layer 33 may include tetraethyl orthosilicate (TEOS).

Figure 18:
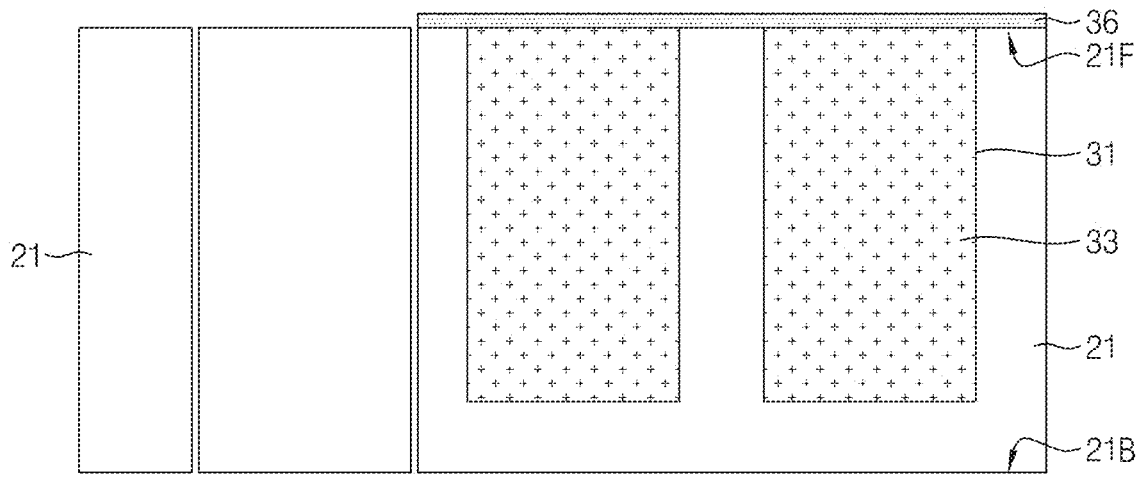

Referring to FIG. 18, a blocking layer 36 may be formed on the substrate 21. The blocking layer 36 may be partially removed, thereby partially exposing the first surface 21F of the substrate 21. The blocking layer 36 may extend on the first surface 21F of the substrate 21 while completely covering the via insulating layer 33 in plan view. The blocking layer 36 may partially cover the first surface 21F and, as such, may partially expose the first surface 21F. A region of the first surface 21F of the substrate 21 adjacent to the via insulating layer 33 may be covered by the blocking layer 36. A region of the first surface 21F of the substrate 21 relatively spaced away from the via insulating layer 33 may be exposed.

The blocking layer 36 may include a single layer or multiple layers. The blocking layer 36 may include at least two selected from the group consisting of or including Si, O, N, C, H, and B. The blocking layer 36 may include silicon oxide, silicon nitride, silicon oxynitride, silicon boron nitride (SiBN), silicon carbon nitride (SiCN), low-k dielectrics, high-k dielectrics, or a combination thereof. The blocking layer 36 may include a material different from that of the via insulating layer 33. The blocking layer 36 may include a material having etch selectivity with respect to the via insulating layer 33. In some example embodiments, the via insulating layer 33 may include silicon oxide and may not include a nitride, and the blocking layer 36 may include a nitride such as silicon nitride and may not include an oxide.

Figure 19:
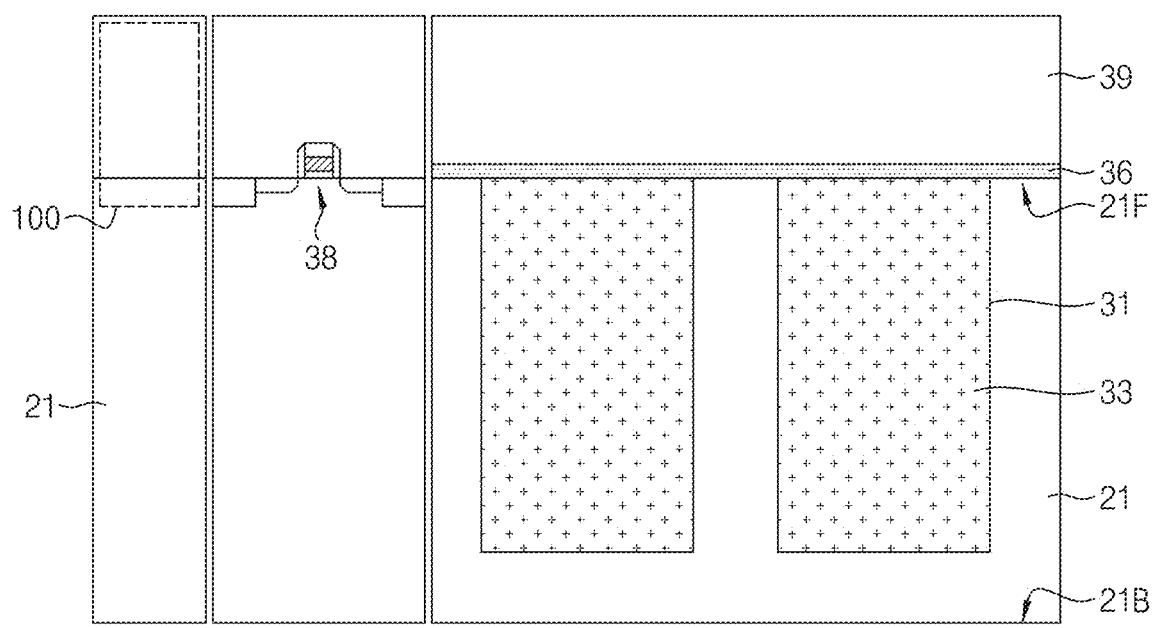

Referring to FIG. 19, a plurality of active/passive devices, a transistor 38 and a first insulting layer 39, which may be identical or similar to those described with reference to FIG. 14, may be formed on the substrate 21.

The plurality of active/passive devices and the transistor 38, which may be identical or similar to those described with reference to FIG. 14, may be formed in the exposed region of the first surface 21F of the substrate 21 and/or over the exposed region. A process of forming the plurality of active/passive devices and the transistor 38, which may be identical or similar to those described with reference to FIG. 14, may correspond to a front-end-of-line (FEOL) process. The transistor 38 may be or may include a planar transistor, a fin field effect transistor (finFET), a multi-bridge channel transistor such as an MBCFET®, a nano-wire transistor, a vertical transistor, a recess channel transistor, a 3-D transistor, or a combination thereof, and may be N-type, and/or may be P-type.

The first insulating layer 39 may cover the transistor 38 and the plurality of active/passive devices. The first insulating layer 39 may cover the plurality of active/passive devices in plan view. The first insulating layer 39 may include a single layer or multiple layers. The first insulating layer 39 may include at least two selected from the group consisting of Si, O, N, C, H, and B. The first insulating layer 39 may include silicon oxide, silicon nitride, silicon oxynitride, silicon boron nitride (SiBN), silicon carbon nitride (SiCN), low-k dielectrics, high-k dielectrics, or a combination thereof. In some example embodiments, the first insulating layer 39 may include a material different from that of the blocking layer 36. For example, the first insulating layer 39 may include an oxide such as silicon oxide.

In accordance with some example embodiments of the disclosure, the process of forming the via insulating layer 33 is performed prior to the process of forming various active/passive devices (for example, the transistor 38, and a plurality of cell transistors, a plurality of cell capacitors, etc., which are identical or similar to those described with reference to FIG. 14) and, as such, various process conditions may be selectively applied in order to obtain a desired film quality. For example, even when the process of forming the via insulating layer 33 includes a high-temperature process, variation in physical/chemical characteristics of the various active/passive devices may be prevented or reduced in likelihood of occurrence and/or in impact from occurring.

Figure 20:
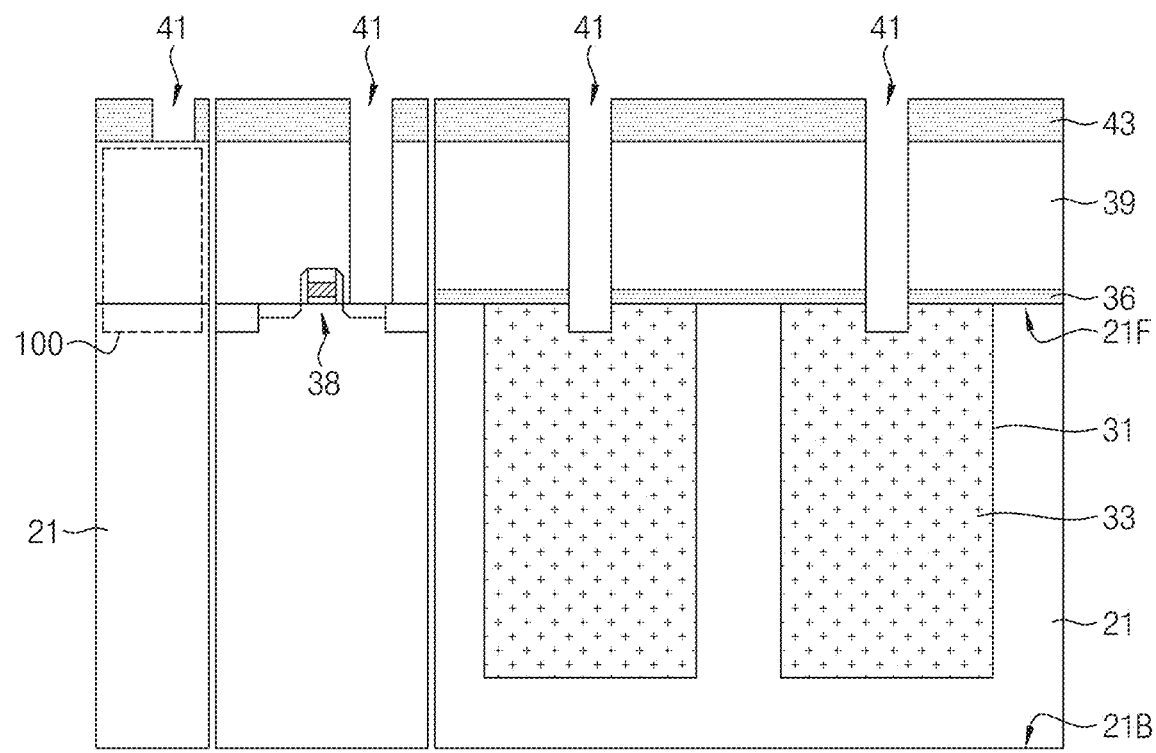

Referring to FIG. 20, a second mask pattern 43 may be formed on the first insulating layer 39. Using the second mask pattern 43 as an etch mask, a plurality of first contact holes 41, which extends through the first insulating layer 39 and the block layer 36, thereby exposing the via insulating layer 33, may be formed. Formation of the plurality of first contact holes 41 may include an anisotropic etching process, an isotropic etching process, or a combination thereof. A selected one of the plurality of first contact holes 41 may extend through the first insulating layer 39, thereby exposing the upper electrode ("191" in FIG. 14). Another selected one of the plurality of first contact holes 41 may extend through the first insulating layer 39, thereby exposing the transistor 38.

Figure 21:
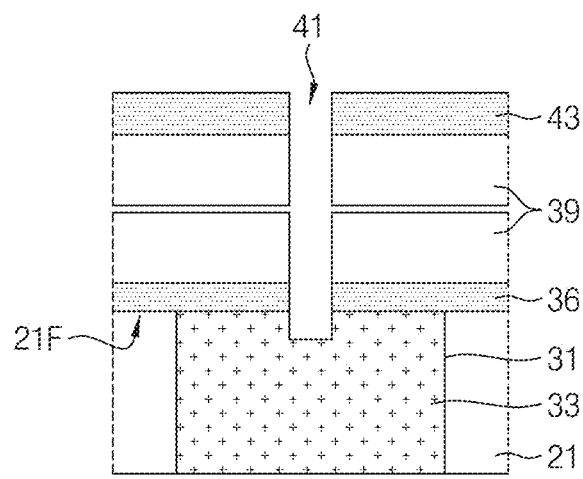

Referring to FIG. 21, the first contact hole 41 may extend into the via insulating layer 33 while extending through the first insulating layer 39 and the blocking layer 36. A lowermost end of the first contact hole 41 may be formed at a lower level than the first surface 21F of the substrate 21.

Figure 22:
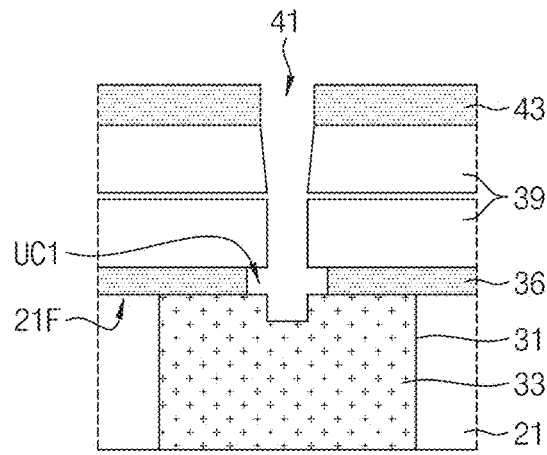

Referring to FIG. 22, the first contact hole 41 may extend into the via insulating layer 33 while extending through the first insulating layer 39 and the blocking layer 36. The first contact hole 41 may be laterally enlarged between the first insulating layer 39 and the via insulating layer 33. The blocking layer 36 may be selectively additionally removed. An undercut region UC1 may be formed between the first insulating layer 39 and the via insulating layer 33. The undercut region UC1 may communicate with the first contact hole 41.

Figure 23:
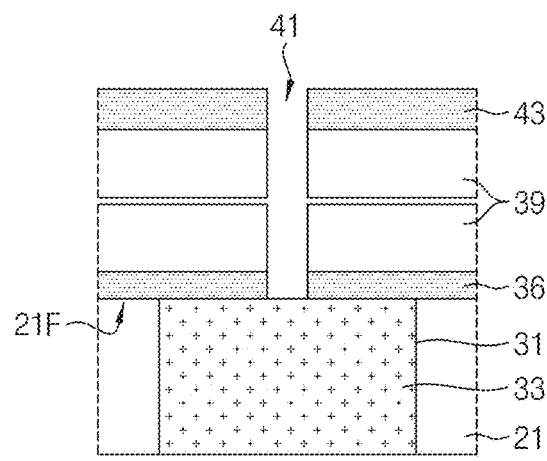

Referring to FIG. 23, the first contact hole 41 may extend through the first insulating layer 39 and the blocking layer 36. The via insulating layer 33 may be exposed at a bottom of the first contact hole 41. A lowermost end of the first contact hole 41 may be substantially coplanar with the first surface 21F.

Figure 24:
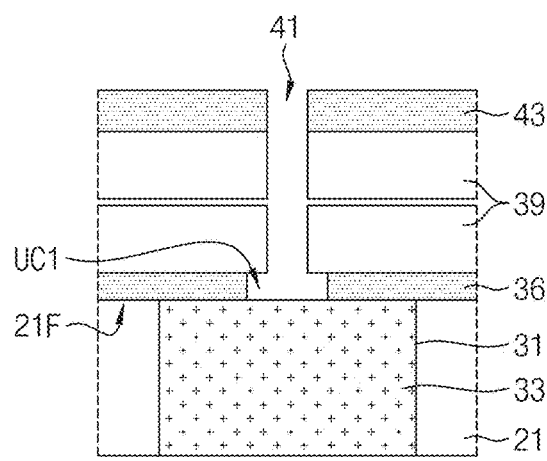

Referring to FIG. 24, the first contact hole 41 may extend through the first insulating layer 39 and the blocking layer 36. The via insulating layer 33 may be exposed at a bottom of the first contact hole 41. The first contact hole 41 may be laterally enlarged between the first insulating layer 39 and the via insulating layer 33. The blocking layer 36 may be selectively additionally removed. An undercut region UC1 may be formed between the first insulating layer 39 and the via insulating layer 33. The undercut region UC1 may communicate with the first contact hole 41. A lowermost end of the first contact hole 41 may be substantially coplanar with the first surface 21F.

Figure 25:
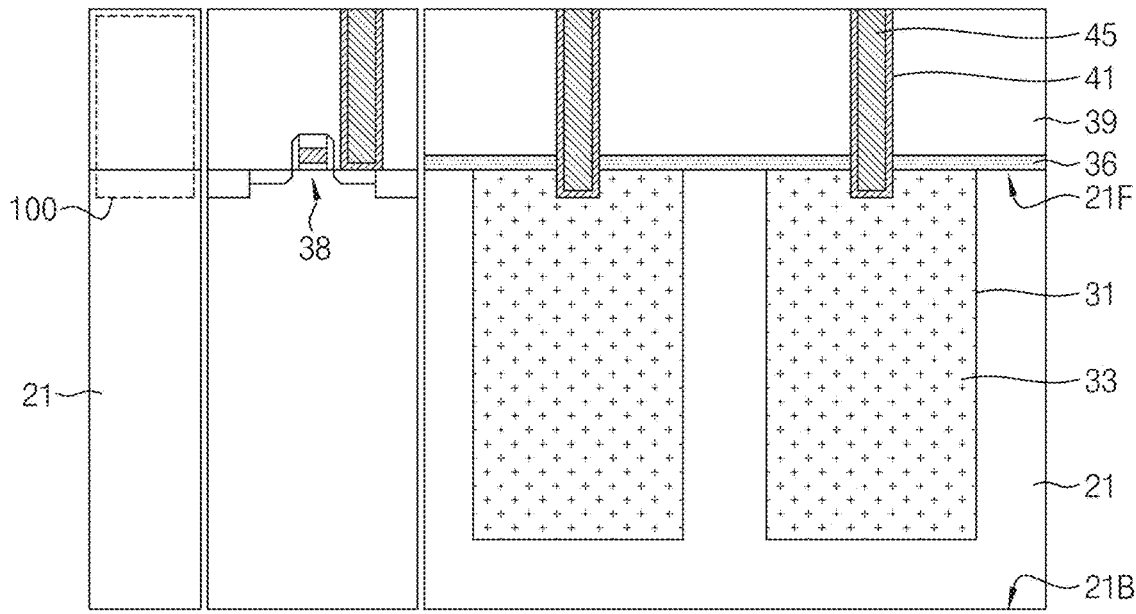

Referring to FIG. 25, a plurality of first contact plugs 45 may be formed in the plurality of first contact holes 41. Formation of the plurality of first contact plugs 45 may include a plurality of thin film formation processes and a planarization process. The second mask pattern 43 may be removed. Upper surfaces of the plurality of first contact plugs 45 and the first insulating layers 39 may be substantially coplanar. Each of the plurality of first contact plugs 45 may include a configuration similar to the configuration described with reference to FIGS. 2 to 8. A selected one of the plurality of first contact plugs 45 may contact the transistor 38 while extending through the first insulating layer 39.

Figure 26:
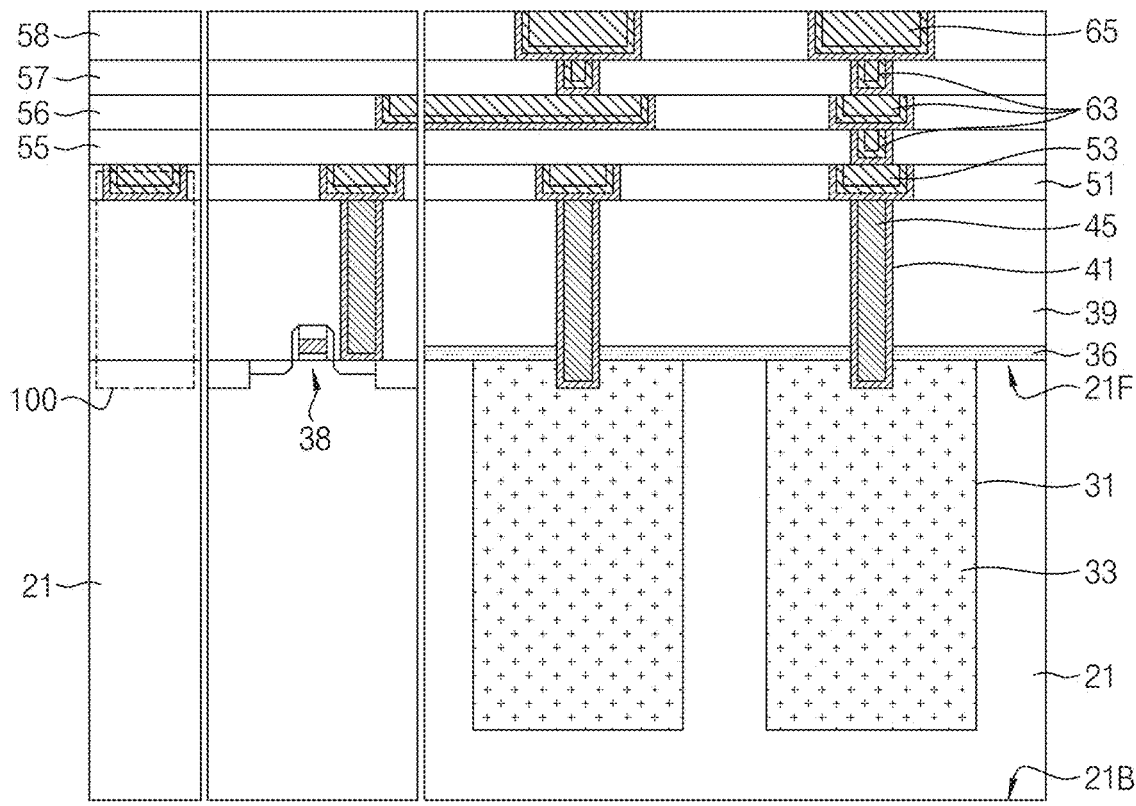

Referring to FIG. 26, a second insulating layer 51 may be formed on the first insulating layer 39. A plurality of first wirings 53 may be formed in the second insulating layer 51. The plurality of first wirings 53 may include a configuration similar to the configuration described with reference to FIG. 2. A third insulating layer 55, a fourth insulating layer 56, a fifth insulating layer 57, and a sixth insulating layer 58 may be sequentially stacked on the second insulating layer 51.

A plurality of second wirings 63 may be formed in the third insulating layer 55, the fourth insulating layer 56 and the fifth insulating layer 57. The plurality of second wirings 63 may include a plurality of horizontal wirings and/or a plurality of vertical wirings. Each of the plurality of second wirings 63 may include a configuration similar to that of the plurality of first wirings 53. A plurality of first pads 65 may be formed in the sixth insulating layers 58. Each of the plurality of first pads 65 may include a configuration similar to that of the plurality of first wirings 53.

Each of the second insulating layer 51, the third insulating layer 55, the fourth insulating layer 56, the fifth insulating layer 57 and the sixth insulating layer 58 may include a single layer or multiple layers. Each of the second insulating layer 51, the third insulating layer 55, the fourth insulating layer 56, the fifth insulating layer 57 and the sixth insulating layer 58 may include at least two selected from the group consisting of or including Si, O, N, C, H, and B, and may include the same or different elements. Each of the second insulating layer 51, the third insulating layer 55, the fourth insulating layer 56, the fifth insulating layer 57 and the sixth insulating layer 58 may include silicon oxide, silicon nitride, silicon oxynitride, silicon boron nitride (SiBN), silicon carbon nitride (SiCN), low-k dielectrics, high-k dielectrics, or a combination thereof. For example, each of the second insulating layer 51, the third insulating layer 55, the fourth insulating layer 56, the fifth insulating layer 57 and the sixth insulating layer 58 may include an oxide such as silicon oxide.

Figure 27:
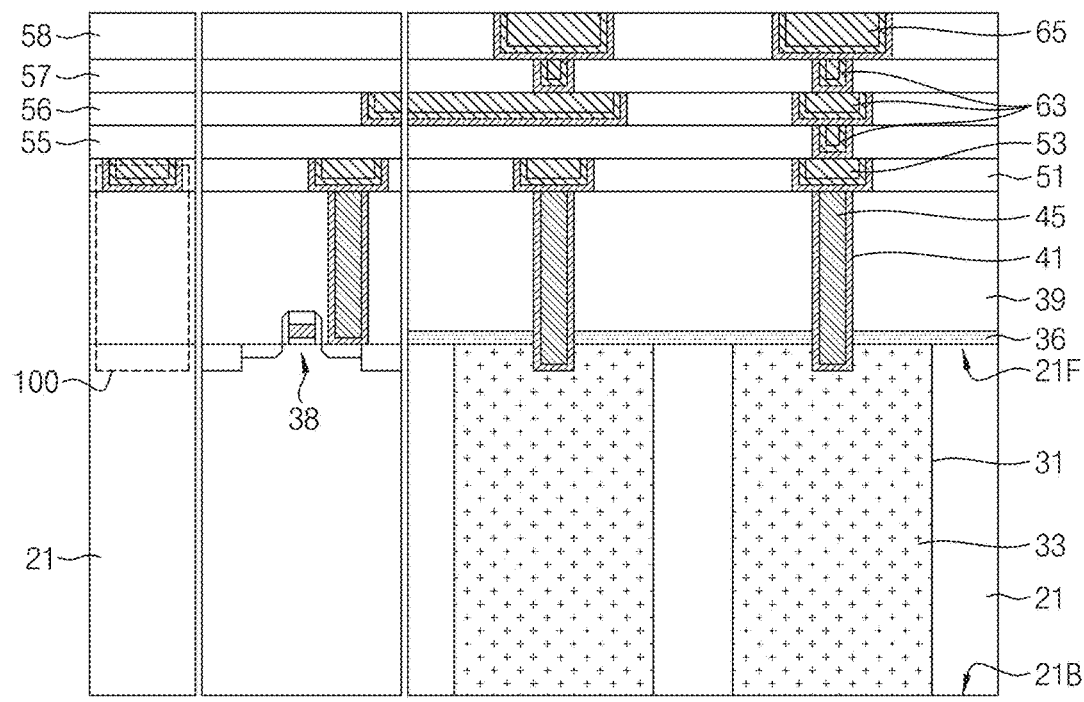

Referring to FIG. 27, the substrate 21 may be partially removed, thereby exposing the via insulating layer 33. A lower surface of the via insulating layer 33 and the second surface 21B of the substrate 21 may be exposed on substantially the same plane.

Figure 28:
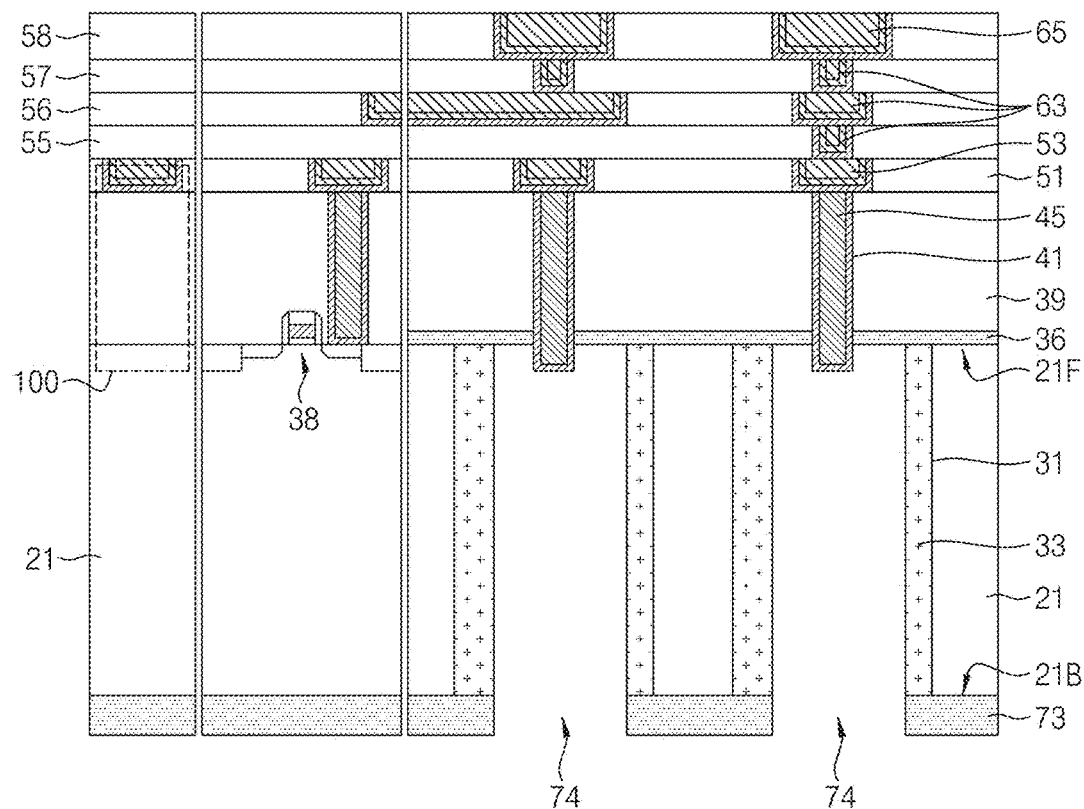

Referring to FIG. 28, a plurality of through holes 74 extending through the via insulating layer 33 may be formed. Formation of the plurality of through holes 74 may include a patterning process. Formation of the plurality of through holes 74 may include a lithography process.

In some example embodiments, a third mask pattern 73 may be formed on the lower surface of the via insulating layer 33 and the second surface 21B of the substrate 21. Using the third mask pattern 73 as an etch mask, the via insulating layer 33 may be etched, thereby forming the plurality of through holes 74. Formation of the plurality of through holes 74 may include an anisotropic etching process, an isotropic etching process, or a combination thereof. The plurality of first contact plugs 45 and the blocking layer 36 may be exposed in the plurality of through holes 74. Each of the plurality of through holes 74 may exhibit various cross-sectional profiles. Each of the plurality of through holes 74 may include an alignment error caused by alignment variability of a lithography process.

Referring to FIG. 29, the through hole 74 may be misaligned from the via hole 31. The center of the through hole 74 may be misaligned from the center of the via hole 31. A line perpendicular to the first surface 21F while passing through the center of the through hole 74 and a line perpendicular to the first surface 21F while passing through the center of the via hole 31 may be spaced apart from each other. The through hole 74 may exhibit various cross-sectional profiles. The through hole 74 may be formed such that the width of an upper portion thereof and the width of a lower portion thereof are similar.

Referring to FIG. 30, the through hole 74 and the via hole 31 may exhibit various cross-sectional profiles. In some example embodiments, the through hole 74 may be formed such that the width of a lower portion thereof is greater than the width of an upper portion thereof. The through hole 74 may have a width relatively decreasing as the through hole 74 extends toward the first surface 21F, and the through hole 74 may have a width relatively increasing as the through hole 74 extends toward the second surface 21B.

In some example embodiments, each of the plurality of via holes 31 may be formed such that the width of a lower portion thereof is smaller than the width of an upper portion thereof. Each of the plurality of via holes 31 may have a width relatively increasing as the via hole 31 extends toward the first surface 21F, and each of the plurality of via holes 31 may have a width relatively decreasing as the via hole 31 extends toward the second surface 21B.

Referring to FIG. 31, in some example embodiments, the center of the through hole 74 may be aligned with the center of the via hole 31.

Figure 32:
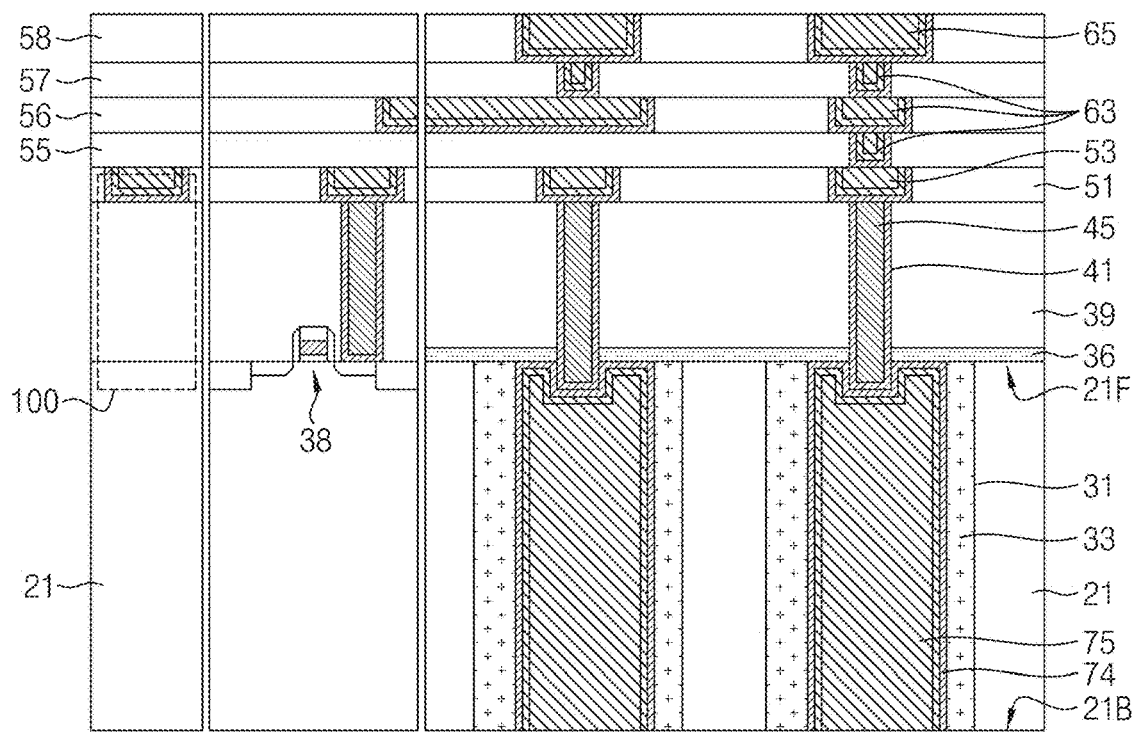

Referring to FIG. 32, a plurality of through-silicon vias 75 may be formed in the plurality of through holes 74. The third mask pattern 73 may be removed, thereby exposing the second surface 21B and the plurality of through-silicon vias 75. The plurality of through-silicon vias 75 may include a configuration similar to the configuration described with reference to FIGS. 1 to 8. The blocking layer 36 may function to prevent or reduce a constituent material of the plurality of through-silicon vias 75 from diffusing into other portions on the substrate 21 during formation of the plurality of through-silicon vias 75.

In some example embodiments, the spacer 36, which is similar to the spacer described with reference to FIGS. 3, 4 and 8, may be formed on sidewalls of the plurality of through holes 74 before formation of the plurality of through-silicon vias 75. Formation of the spacer 36 may include a second thin film formation process and an anisotropic etching process. The second thin film formation process for forming the spacer 36 may be performed at a lower temperature than the first thin film formation process for forming the via insulating layer 33. The second thin film formation process for forming the spacer 36 may be performed at 150 to 400° C. In some example embodiments, the second thin film formation process for forming the spacer 36 may be performed at 300 to 350° C.

Figure 33:
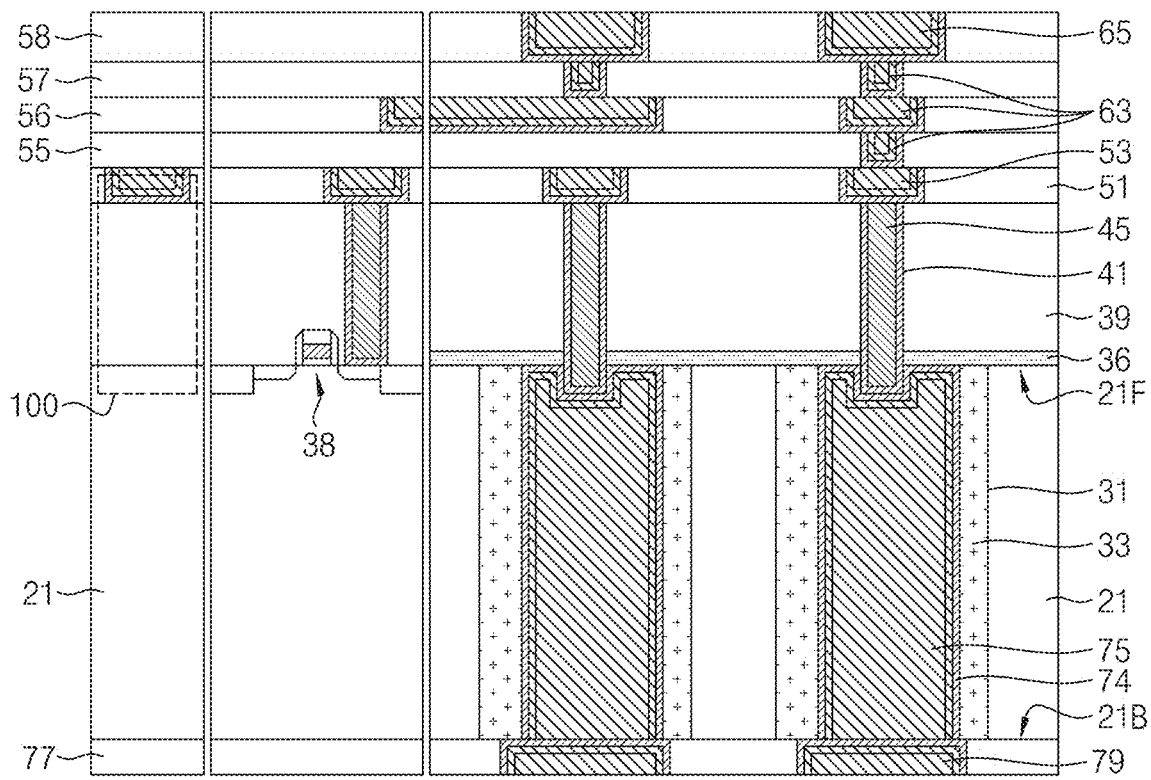

Referring to FIG. 33, a seventh insulating layer 77 may be formed on the second surface 21B and the plurality of through-silicon vias 75. A plurality of second pads 79, which contacts the plurality of through-silicon vias 75 while extending through the seventh insulating layer 77, may be formed. Each of the plurality of second pads 79 may include a configuration similar to that of the plurality of through-silicon vias 75.

The seventh insulating layer 77 may include a single layer or multiple layers. The seventh insulating layer 77 may include at least two selected from the group consisting or including of Si, O, N, C, H, and B. The seventh insulating layer 77 may include silicon oxide, silicon nitride, silicon oxynitride, silicon boron nitride (SiBN), silicon carbon nitride (SiCN), low-k dielectrics, high-k dielectrics, or a combination thereof. For example, the seventh insulating layer 77 may include an oxide such as silicon oxide.

Again referring to FIG. 1, a plurality of outer terminals 82 may be formed on the plurality of first pads 65, and a plurality of second outer terminals 86 may be formed on the plurality of second pads 79. Each of the plurality of first outer terminals 82 and the plurality of second outer terminals 86 may include a solder ball, a conductive bump, a conductive pin, a conductive lead, a conductive pillar, or a combination thereof. The plurality of first outer terminals 82 and the plurality of second outer terminals 86 may be selectively omitted.

Figure 34:
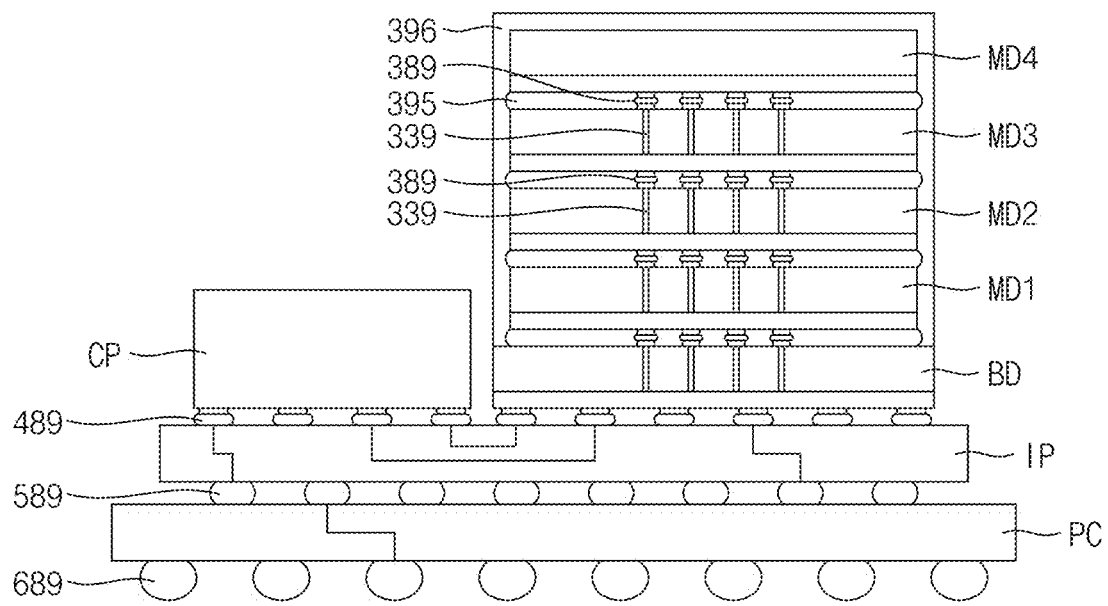
FIGS. 34 and 35 are sectional views explaining semiconductor devices according to some example embodiments.
Figure 35:
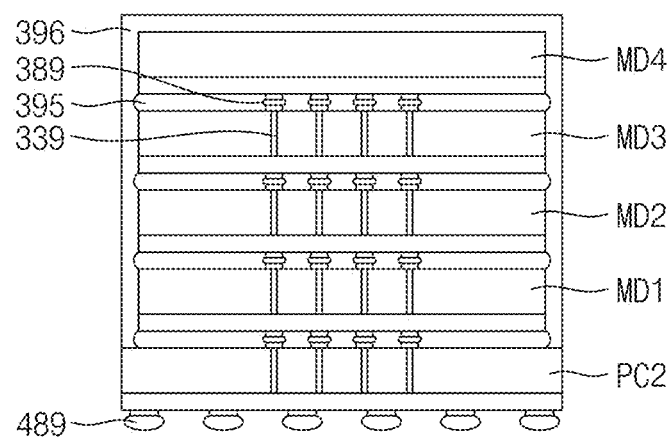

FIGS. 34 and 35 are sectional views explaining semiconductor devices according to some example embodiments. Semiconductor devices according to some example embodiments may include a hybrid memory cube (HMC), a high bandwidth memory (HBM), a double data rate fifth-generation dynamic random access memory (DDR5 DRAM), or a combination thereof.

Referring to FIG. 34, the semiconductor devices according to some example embodiments of the disclosure may include a printed circuit board PC, a relay board IP, a plurality of semiconductor chips CP, BD, and MD1 to MD4, a plurality of bumps 389, 489, 589 and 689, an adhesive layer 395, and an encapsulator 396. The plurality of semiconductor chips CP, BD, and MID1 to MID4 may include a microprocessor CP, a buffer chip BD, and a plurality of memory chips MD1 to MD4. In some example embodiments, the plurality of memory chips MD1 to MD4 may be sequentially vertically stacked on the buffer chip BD. The plurality of memory chips MD1 to MD4 may include memory chips corresponding to a combination of various numbers such as 3, 4, 7, 8, 11, 12, 15, 16, 19 or more.

The plurality of memory chips MD1 to MD4 may include a first memory chip MD1, a second memory chip MD2, a third memory chip MD3, and a fourth memory chip MD4. At least a part of the plurality of memory chips MD1 to MD4 may include a plurality of through-silicon vias 339. The plurality of bumps 389, 489, 589 and 689 may include a plurality of first bumps 389, a plurality of second bumps 489, a plurality of third bumps 589, and a plurality of fourth bumps 689.

The printed circuit board PC may include a rigid printed circuit board, a flexible printed circuit board, or a rigid-flexible printed circuit board. The printed circuit board PC may include a multilayer circuit board. The printed circuit board PC may correspond to a package substrate or a main board. The plurality of fourth bumps 689 may be disposed at a lower surface of the printed circuit board PC. The relay board IP may be disposed on the printed circuit board PC.

The plurality of third bumps 589 may be disposed between the printed circuit board PC and the relay board IP.

The plurality of semiconductor chips CP, BD, and MD1 to MD4 may be disposed on the relay board IP. The relay board IP may include a semiconductor substrate such as a silicon interposer. In some example embodiments, the microprocessor CP and the buffer chip BD may be disposed on the relay board IP. The plurality of second bumps 489 may be disposed between the microprocessor CP and the relay board IP and the buffer chip BD and the relay board IP. The microprocessor CP may include various kinds of processors such as a graphics processing unit (GPU) or an application processor (AP). The buffer chip BD may include various devices such as a memory controller. The buffer chip BD may be connected to the microprocessor CP via the relay board IP and the plurality of second bumps 489.

The plurality of memory chips MD1 to MD4 may be sequentially stacked on the buffer chip BD. Each of the plurality of memory chips MD1 to MD4 may include a plurality of constituent elements similar to those described with reference to FIGS. 1 to 33. For example, each of the plurality of memory chips MD1 to MD4 may include the plurality of through-silicon vias 339. The plurality of through-silicon vias 339 may include a configuration similar to the configuration of the plurality of through-silicon vias 75 described with reference to FIGS. 1 to 33.

In some example embodiments, the adhesive layer 395 may be disposed among the plurality of memory chips MD1 to MD4 and between the first memory chip MD1 and the buffer chip BD. The adhesive layer 395 may include a non-conductive film (NCF).

The plurality of first bumps 389 may be disposed among the plurality of memory chips MD1 to MD4 and between the first memory chip MD1 and the buffer chip BD. The plurality of first bumps 389 may extend in the adhesive layer 395. The plurality of first bumps 389 may extend through the adhesive layer 395. The plurality of memory chips MD1 to MD4 may be connected to the buffer chip BD via the plurality of first bumps 389 and the plurality of through-silicon vias 339. The encapsulator 396, which covers the plurality of memory chips MD1 to MD4, may be disposed on the buffer chip BD. The encapsulator 396 may include an epoxy molding compound (EMC).

Referring to FIG. 35, the semiconductor devices according to some example embodiments of the disclosure may include a plurality of memory chips MD1 to MD4 sequentially stacked on a package substrate PC2.

The package substrate PC2 may include a printed circuit board such as a rigid printed circuit board, a flexible printed circuit board, or a rigid-flexible printed circuit board. The plurality of memory chips MD1 to MD4 may include a first memory chip MD1, a second memory chip MD2, a third memory chip MD3, and a fourth memory chip MD4. An adhesive layer 395 may be disposed among the plurality of memory chips MD1 to MD4 and between the first memory chip MD1 and the package substrate PC2. The adhesive layer 395 may include an NCF.

The plurality of memory chips MD1 to MD4 may be connected to the package substrate PC2 via a plurality of first bumps 389 and a plurality of through-silicon vias 339. The plurality of through-silicon vias 339 may include a configuration similar to the configuration of the plurality of through-silicon vias 75 described with reference to FIGS. 1 to 33. An encapsulator 396 covering the plurality of memory chips MD1 to MD4 may be disposed on the package substrate PC2. The encapsulator 396 may include an epoxy molding compound EMC. A plurality of second bumps 489 may be disposed at a lower surface of the package substrate PC2.

In accordance with some example embodiments, a via insulating layer, a blocking layer, a plurality of active/passive devices, and a through-silicon via may be provided. The via insulating layer may be formed prior to a process of forming the plurality of active/passive devices. Even when a process of forming the via insulating layer includes a high-temperature thin film formation process, it may be possible to prevent or reduce variation in characteristics of the plurality of active/passive devices. The through-silicon via may include an alignment error caused by alignment variability of a lithography process. The blocking layer may function to prevent, or reduce the probability of occurrence of and/or the impact from occurrence of a constituent material of the through-silicon via from being diffused among elements constituting the plurality of active/passive devices. Semiconductor devices having improved or excellent electrical characteristics and a method of forming the same may be provided.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While various example embodiments have been described with reference to the accompanying drawings, it should be understood by those of ordinary skill in the art that various modifications may be made without departing from the scope of the disclosure and without changing essential features thereof. Furthermore example embodiments are not necessarily mutually exclusive with one another; for example, some example embodiments may include one or more features described with reference to one or more figures, and may also include one or more other features described with reference to one or more other figures. Therefore, various example embodiments should be considered in a descriptive sense only and not for purposes of limitation.

What is claimed is:
1. A semiconductor device comprising:
a substrate comprising a first surface and a second surface opposing the first surface;

a via insulating layer extending through the substrate;
a through-silicon via extending through the via insulating layer, a center of the through-silicon via misaligned from a center of the via insulating layer;
a blocking layer on the first surface;
a first insulating layer on the blocking layer; and
a contact plug contacting the through-silicon via and extending through the first insulating layer and the blocking layer.

2. The semiconductor device according to claim 1, wherein,
the through-silicon via comprises a first side surface and a second side surface opposing the first side surface,
the via insulating layer comprises a first portion adjacent to the first side surface, and a second portion adjacent to the second side surface, and
a first horizontal width of the first portion is greater than a second horizontal width of the second portion.

3. The semiconductor device according to claim 1, wherein a distance between a lowermost end of the contact plug and the second surface is less than or equal to a distance between the first surface and the second surface.

4. The semiconductor device according to claim 1, wherein a distance between a lowermost end of the contact plug and the second surface is less than or equal to a distance between an uppermost end of the via insulating layer and the second surface.

5. The semiconductor device according to claim 1, wherein the via insulating layer has a width relatively increasing as the via insulating layer extends toward the first surface, and the via insulating layer has a width relatively decreasing as the via insulating layer extends toward the second surface.

6. The semiconductor device according to claim 1, wherein the through-silicon via has a width relatively decreasing as the through-silicon via extends toward the first surface, and the through-silicon via has a width relatively increasing as the through-silicon via extends toward the second surface.

7. The semiconductor device according to claim 1, wherein a horizontal width of the through-silicon via is greater than a horizontal width of the contact plug.

8. The semiconductor device according to claim 1, wherein the through-silicon via contacts a lower surface and a side surface of the contact plug.

9. The semiconductor device according to claim 1, wherein the through-silicon via contacts the blocking layer.

10. The semiconductor device according to claim 1, wherein an uppermost end of the through-silicon via is coplanar with the first surface.

11. The semiconductor device according to claim 1, wherein the blocking layer extends on the via insulating layer.

12. The semiconductor device according to claim 1, wherein,
the via insulating layer comprises silicon oxide, and
the blocking layer comprises silicon nitride.

13. The semiconductor device according to claim 1, wherein:
the contact plug comprises tungsten (W), and
the through-silicon via comprises copper (Cu).

14. The semiconductor device according to claim 1, further comprising:
a second insulating layer on the first insulating layer; and
a wiring in the second insulating layer and contacting the contact plug,
wherein the wiring comprises copper (Cu).

15. The semiconductor device according to claim 1, further comprising:
a spacer having a uniform thickness between the through-silicon via and the via insulating layer.

16. A method of forming the semiconductor device of claim 1, comprising:
forming the via insulating layer extending through the substrate, the forming the via insulating layer comprising performing a first thin film formation process at between 400° C. to 1,300° C.;
forming the contact plug; and
forming the through-silicon via after formation of the via insulating layer and the contact plug.

17. The method according to claim 16, further comprising:
forming a transistor on the substrate after forming the via insulating layer and before forming the through-silicon via.

18. The method according to claim 16, further comprising:
forming a spacer between the through-silicon via and the via insulating layer after forming the via insulating layer and the contact plug,
wherein the forming the spacer comprises performing a second thin film formation process at a lower temperature than the forming the via insulating layer.

19. The method according to claim 18, wherein the forming the spacer comprises the second thin film formation process, which is performed at between 150° C. to 400° C.

20. A semiconductor device comprising:
a substrate comprising a first surface and a second surface opposing the first surface;
a via insulating layer extending through the substrate, the via insulating layer having a width relatively increasing as the via insulating layer extends toward the first surface and having a width relatively decreasing as the via insulating layer extends toward the second surface;
a through-silicon via extending through the via insulating layer, the through-silicon via having a width relatively decreasing as the through-silicon via extends toward the first surface and having a width relatively increasing as the through-silicon via extends toward the second surface;
a blocking layer on the first surface;
a first insulating layer on the blocking layer; and
a contact plug contacting the through-silicon via and extending through the first insulating layer and the blocking layer.

* * * * *